US010284167B2

(12) United States Patent
Srirattana et al.

(10) Patent No.: US 10,284,167 B2
(45) Date of Patent: May 7, 2019

(54) SELF-ADJUSTING ELECTROMAGNETIC COUPLER WITH AUTOMATIC FREQUENCY DETECTION

(71) Applicant: SKYWORKS SOLUTIONS, INC., Woburn, MA (US)

(72) Inventors: Nuttapong Srirattana, Billerica, MA (US); David Scott Whitefield, Andover, MA (US); David Ryan Story, Ladera Ranch, CA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/587,508

(22) Filed: May 5, 2017

(65) Prior Publication Data

US 2017/0324392 A1 Nov. 9, 2017

Related U.S. Application Data

(60) Provisional application No. 62/454,971, filed on Feb. 6, 2017, provisional application No. 62/333,368, filed on May 9, 2016.

(51) Int. Cl.
*H01P 5/18* (2006.01)
*H03H 7/40* (2006.01)
*H03H 7/01* (2006.01)

(52) U.S. Cl.
CPC ............... *H03H 7/40* (2013.01); *H01P 5/185* (2013.01); *H01P 5/188* (2013.01); *H03H 7/0161* (2013.01)

(58) Field of Classification Search
CPC ............... H01P 5/18; H03H 7/01; H03H 7/40
(Continued)

(56) References Cited

U.S. PATENT DOCUMENTS 3,611,199 A 10/1971 Safran
3,868,594 A 2/1975 Cornwell et al.
(Continued)

FOREIGN PATENT DOCUMENTS

EP 2503701 A2 9/2012
JP S62-159502 A 7/1987
(Continued)

OTHER PUBLICATIONS

International Search Report and Written Opinion from corresponding International Application No. PCT/US2017/031219 dated Jul. 24, 2017.

*Primary Examiner* — Dean O Takaoka
(74) *Attorney, Agent, or Firm* — Lando & Anastasi, LLP

(57) ABSTRACT

Electromagnetic coupler systems including built-in frequency detection, and modules and devices including such. One example of an electromagnetic coupler system include an electromagnetic coupler having an input port, an output port, a coupled port, and an isolation port, the electromagnetic coupler including a main line extending between the input port and the output port, and a coupled line extending between the coupled port and the isolation port, the electromagnetic coupler being configured to produce a coupled signal at the coupled port responsive to receiving an input signal at the input port. An adjustable termination impedance is connected to the isolation port. A frequency detector is connected to the adjustable termination impedance and to the coupled port, and configured to detect a frequency of the coupled signal and provide an impedance control signal to tune the adjustable termination impedance based on the frequency of the coupled signal.

20 Claims, 23 Drawing Sheets

(58) Field of Classification Search
USPC .......................................... 333/109–112, 116
See application file for complete search history.

(56) References Cited

U.S. PATENT DOCUMENTS

| | | | |
|---|---|---|---|
| 4,460,875 A | 7/1984 | Harman | |
| 4,677,399 A | 6/1987 | Le Dain et al. | |
| 4,764,740 A | 8/1988 | Meyer | |
| 5,038,112 A | 8/1991 | O'Neill | |
| 5,222,246 A | 6/1993 | Wolkstein | |
| 5,276,411 A | 1/1994 | Woodin, Jr. et al. | |
| 5,363,071 A | 11/1994 | Schwent et al. | |
| 5,487,184 A | 1/1996 | Nagode | |
| 5,625,328 A | 4/1997 | Coleman, Jr. | |
| 5,745,016 A | 4/1998 | Salminen | |
| 5,767,753 A | 6/1998 | Ruelke | |
| 5,903,820 A | 5/1999 | Hagstrom | |
| 6,020,795 A | 2/2000 | Kim | |
| 6,078,299 A | 6/2000 | Scharfe, Jr. | |
| 6,108,527 A | 8/2000 | Urban et al. | |
| 6,329,880 B2 | 12/2001 | Akiya | |
| 6,496,708 B1 | 12/2002 | Chan et al. | |
| 6,559,740 B1 | 5/2003 | Schulz et al. | |
| 6,771,141 B2 | 8/2004 | Iida et al. | |
| 6,803,818 B2* | 10/2004 | van Amerom | H03G 3/3042 330/144 |
| 6,972,640 B2* | 12/2005 | Nagamori | H01P 5/185 333/109 |
| 7,042,309 B2 | 5/2006 | Podell | |
| 7,224,244 B2 | 5/2007 | Drapac et al. | |
| 7,230,316 B2 | 6/2007 | Yamazaki et al. | |
| 7,236,069 B2 | 6/2007 | Puoskari | |
| 7,305,223 B2 | 12/2007 | Liu et al. | |
| 7,319,370 B2 | 1/2008 | Napijalo | |
| 7,336,142 B2 | 2/2008 | Vogel | |
| 7,493,093 B2 | 2/2009 | Boerman et al. | |
| 7,538,635 B2 | 5/2009 | Fukuda et al. | |
| 7,546,089 B2 | 6/2009 | Bellantoni | |
| 7,966,140 B1 | 6/2011 | Gholson, III et al. | |
| 7,973,358 B2 | 7/2011 | Hanke et al. | |
| 8,115,234 B2 | 2/2012 | Nakajima et al. | |
| 8,175,554 B2 | 5/2012 | Camuffo et al. | |
| 8,248,302 B2 | 8/2012 | Tsai et al. | |
| 8,289,102 B2 | 10/2012 | Yamamoto et al. | |
| 8,315,576 B2 | 11/2012 | Jones | |
| 8,334,580 B2 | 12/2012 | Sakurai et al. | |
| 8,417,196 B2 | 4/2013 | Kitching et al. | |
| 8,526,890 B1 | 9/2013 | Chien et al. | |
| 8,606,198 B1 | 12/2013 | Wright | |
| 8,633,761 B2 | 1/2014 | Lee | |
| 8,761,026 B1 | 6/2014 | Berry et al. | |
| 8,810,331 B2 | 8/2014 | Gu et al. | |
| 9,014,647 B2 | 4/2015 | Kitching et al. | |
| 9,214,967 B2 | 12/2015 | Reisner et al. | |
| 9,356,330 B1 | 5/2016 | Donoghue et al. | |
| 9,425,835 B2 | 8/2016 | Seckin et al. | |
| 9,496,902 B2 | 11/2016 | Srirattana et al. | |
| 9,553,617 B2 | 1/2017 | Srirattana et al. | |
| 9,634,371 B2 | 4/2017 | Swarup et al. | |
| 9,647,314 B1 | 5/2017 | Nguyen et al. | |
| 9,748,627 B2 | 8/2017 | Sun et al. | |
| 9,755,670 B2 | 9/2017 | Chen et al. | |
| 2002/0097100 A1 | 7/2002 | Woods et al. | |
| 2002/0113601 A1* | 8/2002 | Swank, II | G01R 27/06 324/637 |
| 2002/0113666 A1 | 8/2002 | Yamazaki et al. | |
| 2002/0139975 A1 | 10/2002 | Lewis et al. | |
| 2003/0214365 A1 | 11/2003 | Adar et al. | |
| 2004/0127178 A1 | 7/2004 | Kuffner | |
| 2004/0201526 A1 | 10/2004 | Knowles et al. | |
| 2005/0017821 A1 | 1/2005 | Sawicki | |
| 2005/0040912 A1 | 2/2005 | Pelz | |
| 2005/0146394 A1 | 7/2005 | Podell | |
| 2005/0170794 A1 | 8/2005 | Koukkari et al. | |
| 2005/0239421 A1 | 10/2005 | Kim et al. | |
| 2006/0232359 A1 | 10/2006 | Fukuda et al. | |
| 2007/0082642 A1 | 4/2007 | Hattori | |
| 2007/0159268 A1 | 7/2007 | Podell | |
| 2008/0036554 A1 | 2/2008 | Krausse et al. | |
| 2008/0055187 A1 | 3/2008 | Tamura et al. | |
| 2008/0056638 A1 | 3/2008 | Glebov et al. | |
| 2008/0070519 A1 | 3/2008 | Okabe | |
| 2008/0112466 A1 | 5/2008 | Sasaki | |
| 2009/0134953 A1 | 5/2009 | Hunt et al. | |
| 2009/0195335 A1 | 8/2009 | Wahl et al. | |
| 2009/0278624 A1 | 11/2009 | Tsai et al. | |
| 2009/0280755 A1 | 11/2009 | Camuffo et al. | |
| 2009/0322313 A1 | 12/2009 | Zhang et al. | |
| 2011/0057746 A1 | 3/2011 | Yamamoto et al. | |
| 2011/0063044 A1 | 3/2011 | Jones | |
| 2011/0148548 A1 | 6/2011 | Uhm et al. | |
| 2011/0199166 A1 | 8/2011 | Carrillo-Ramirez | |
| 2011/0254637 A1 | 10/2011 | Manssen et al. | |
| 2011/0279192 A1 | 11/2011 | Nash et al. | |
| 2011/0298559 A1 | 12/2011 | Kitching et al. | |
| 2012/0019332 A1 | 1/2012 | Hino et al. | |
| 2012/0019335 A1 | 1/2012 | Hoang et al. | |
| 2012/0062333 A1 | 3/2012 | Ezzeddine et al. | |
| 2012/0071123 A1 | 3/2012 | Jones et al. | |
| 2012/0195351 A1* | 8/2012 | Banwell | H04B 1/525 375/219 |
| 2012/0243579 A1 | 9/2012 | Premakanthan et al. | |
| 2013/0005284 A1 | 1/2013 | Dalipi | |
| 2013/0113575 A1 | 5/2013 | Easter | |
| 2013/0194054 A1 | 8/2013 | Presti | |
| 2013/0207741 A1 | 8/2013 | Presti | |
| 2013/0241668 A1 | 9/2013 | Tokuda et al. | |
| 2013/0293316 A1 | 11/2013 | Kitching et al. | |
| 2013/0307635 A1 | 11/2013 | Kase et al. | |
| 2014/0152253 A1 | 6/2014 | Ozaki et al. | |
| 2014/0266499 A1 | 9/2014 | Noe | |
| 2014/0368293 A1 | 12/2014 | Mukaiyama | |
| 2015/0002239 A1 | 1/2015 | Tanaka | |
| 2015/0042412 A1 | 2/2015 | Imbornone et al. | |
| 2015/0043669 A1 | 2/2015 | Ella et al. | |
| 2015/0048910 A1 | 2/2015 | LaFountain et al. | |
| 2015/0072632 A1* | 3/2015 | Pourkhaatoun | H04B 1/0458 455/127.2 |
| 2015/0091668 A1 | 4/2015 | Solomko et al. | |
| 2015/0200437 A1 | 7/2015 | Solomko et al. | |
| 2015/0249485 A1 | 9/2015 | Ouyang et al. | |
| 2015/0270821 A1 | 9/2015 | Natarajan et al. | |
| 2015/0326202 A1 | 11/2015 | Nicholls et al. | |
| 2015/0349742 A1 | 12/2015 | Chen et al. | |
| 2015/0372366 A1 | 12/2015 | Frye | |
| 2016/0025928 A1 | 1/2016 | Onawa | |
| 2016/0028147 A1 | 1/2016 | Srirattana et al. | |
| 2016/0028420 A1 | 1/2016 | Srirattana et al. | |
| 2016/0043458 A1 | 2/2016 | Sun et al. | |
| 2016/0065167 A1 | 3/2016 | Granger-Jones et al. | |
| 2016/0079649 A1 | 3/2016 | Ilkov et al. | |
| 2016/0079650 A1 | 3/2016 | Solomko et al. | |
| 2016/0172737 A1 | 6/2016 | Srirattana et al. | |
| 2016/0172738 A1 | 6/2016 | Srirattana et al. | |
| 2016/0172739 A1 | 6/2016 | Srirattana et al. | |
| 2016/0172740 A1 | 6/2016 | Srirattana et al. | |
| 2016/0268994 A1 | 9/2016 | Granger-Jones et al. | |
| 2016/0344430 A1 | 11/2016 | Srirattana et al. | |
| 2016/0344431 A1 | 11/2016 | Srirattana et al. | |
| 2016/0373146 A1* | 12/2016 | Manssen | H03H 7/40 |
| 2017/0026020 A1* | 1/2017 | Solomko | H03H 7/48 |
| 2017/0033428 A1 | 2/2017 | Ootsuka et al. | |
| 2017/0063425 A1 | 3/2017 | Khlat et al. | |
| 2017/0085245 A1 | 3/2017 | Srirattana et al. | |
| 2017/0141802 A1* | 5/2017 | Solomko | G01R 27/06 |

FOREIGN PATENT DOCUMENTS

| | | |
|---|---|---|
| JP | 2000-077915 A | 3/2000 |
| JP | 2001127664 A | 5/2001 |
| JP | 2013126067 A | 6/2013 |
| KR | 20040037465 A | 5/2004 |
| KR | 20110118289 A | 10/2011 |
| KR | 20120007790 A | 1/2012 |

(56) References Cited

FOREIGN PATENT DOCUMENTS

| | | |
|---|---|---|
| WO | 2005018451 A1 | 3/2005 |
| WO | 2015020927 A2 | 2/2015 |
| WO | 2015134979 A1 | 9/2015 |

* cited by examiner

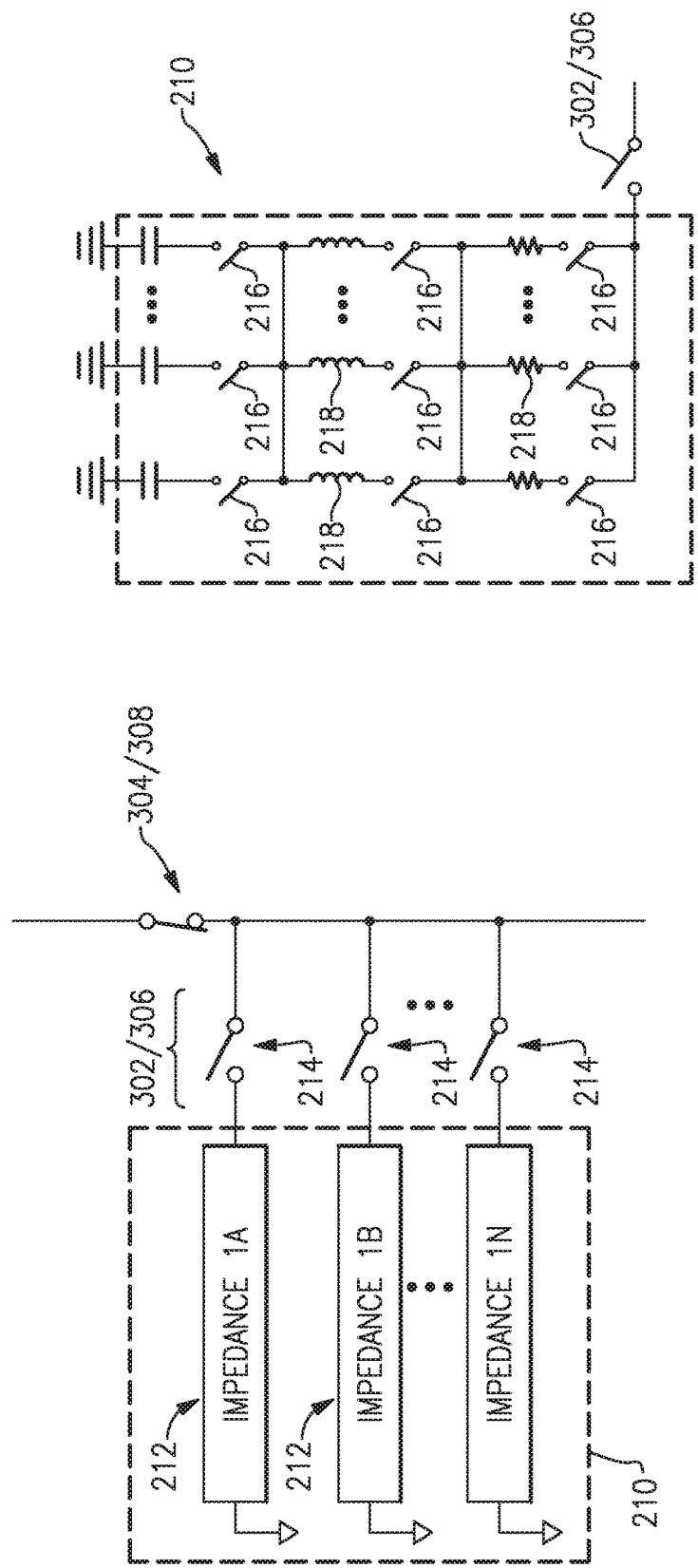

SELF-ADJUSTING ELECTROMAGNETIC COUPLER WITH AUTOMATIC FREQUENCY DETECTION

CROSS-REFERENCE TO RELATED APPLICATIONS

This application claims the benefit under 35 U.S.C. § 119(e) of U.S. Provisional Application Nos. 62/333,368 and 62/454,971 filed on May 9, 2016 and Feb. 6, 2017, respectively, each of which is herein incorporated by reference in its entirety for all purposes.

BACKGROUND

Directional couplers are widely used in front end module (FEM) products, such as radio transceivers, wireless handsets, and the like. For example, a directional coupler can be used to detect and monitor radio-frequency (RF) output power. When an RF signal generated by an RF source is provided to a load, such as to an antenna, a portion of the RF signal can be reflected from the load back toward the RF source. An RF coupler can be included in a signal path between the RF source and the load to provide an indication of forward RF power of the RF signal traveling from the RF source to the load and/or an indication of reverse RF power reflected from the load. RF couplers include, for example, directional couplers, bi-directional couplers, multi-band couplers (e.g., dual band couplers), and the like.

Referring to FIG. 1, an RF coupler 100 typically has a power input port 102, a power output port 104, a coupled port 106, and an isolation port 108. The electromagnetic coupling mechanism, which can include inductive or capacitive coupling, is typically provided by two parallel or overlapped transmission lines, such as microstrips, strip lines, coplanar lines, and the like. The transmission line 110 extending between the power input port 102 and the power output port 104 is termed the main line and can provide the majority of the signal from the power input port 102 to the power output port 104. The transmission line 112 extending between the coupled port 106 and the isolation port 108 is termed the coupled line and can be used to extract a portion of the power traveling between the power input port 102 and the power output port 104 for measurement. When a termination impedance 114 is presented to the isolation port 108 (as shown in FIG. 1), an indication of forward RF power traveling from the power input port 102 to the power output port 104 is provided at the coupled port 106. Similarly, when a termination impedance is presented to the coupled port 106, an indication of reverse RF power traveling from the power output port 104 to the power input port 102 is provided at the isolation port 108. The termination impedance 114 is typically implemented by a 50 Ohm shunt resistor in a variety of conventional RF couplers.

SUMMARY OF THE INVENTION

Aspects and embodiments are directed to an electromagnetic coupler with built-in frequency detection and the capability to automatically tune the termination impedance, based on the detected frequency, thereby improving the coupler operation.

According to one embodiment an electromagnetic coupler system comprises an electromagnetic coupler having an input port, an output port, a coupled port, and an isolation port, the electromagnetic coupler including a main transmission line extending between the input port and the output port, and a coupled transmission line extending between the coupled port and the isolation port, the electromagnetic coupler being configured to produce a coupled signal at the coupled port responsive to receiving an input signal at the input port. The electromagnetic coupler system further includes an adjustable termination impedance connected to the isolation port, and a frequency detector connected to the adjustable termination impedance and to the coupled port, the frequency detector being configured to detect a frequency of the coupled signal and to provide an impedance control signal to tune the adjustable termination impedance based on the frequency of the coupled signal. The electromagnetic coupler system may further comprise a controller coupled to the frequency detector and configured to receive the impedance control signal from the frequency detector and to tune the adjustable termination impedance responsive to the impedance control signal.

According to another embodiment a self-adjusting electromagnetic coupler assembly comprises an electromagnetic coupler having an input port, an output port, a coupled port, and an isolation port, the electromagnetic coupler including a main line extending between the input port and the output port, and a coupled line extending between the coupled port and the isolation port, the electromagnetic coupler being configured to produce a coupled signal at the coupled port responsive to receiving an input signal at the input port. The self-adjusting electromagnetic coupler assembly further includes an adjustable termination impedance connected to the isolation port, and a frequency detector connected to the coupled port and configured to detect a frequency of the coupled signal and to provide an impedance control signal to tune the adjustable termination impedance based on the frequency of the coupled signal. In certain examples the self-adjusting electromagnetic coupler assembly may further comprise a controller coupled to the frequency detector and configured to receive the impedance control signal from the frequency detector and to tune the adjustable termination impedance responsive to the impedance control signal.

According to another embodiment a self-adjusting electromagnetic coupler system comprises an electromagnetic coupler having an input port, an output port, a coupled port, and an isolation port, the electromagnetic coupler including a main line extending between the input port and the output port, and a coupled line extending between the coupled port and the isolation port, and the electromagnetic coupler being configured to produce a coupled signal at the coupled port responsive to receiving an input signal at the input port. The a self-adjusting electromagnetic coupler system further includes an adjustable termination impedance connected to the isolation port, and a frequency detector connected to the adjustable termination impedance and to the coupled port, and configured to detect a frequency of the coupled signal and to tune the adjustable termination impedance based on the frequency of the coupled signal.

In one example the adjustable termination impedance includes a tunable resistive-capacitive-inductive circuit. In another example the adjustable termination impedance includes a network of switchable impedance elements. The network of switchable impedance elements can include at least one resistive element, at least one capacitive element, and at least one inductive element, for example.

In one example the frequency detector includes a plurality of frequency selective components, a corresponding plurality of envelope detectors coupled to the plurality of frequency selective components, and at least one voltage comparator connected to the plurality of envelope detectors and configured to compare outputs of the plurality of envelope detectors and to produce an output signal responsive to the comparison. The frequency detector may be configured to provide the impedance control signal based on the output signal from the at least one voltage comparator. In another example the plurality of frequency selective components includes a plurality of bandpass filters, each bandpass filter having a unique frequency passband. In another example the plurality of frequency selective components includes a plurality of narrowband amplifiers. In one example the plurality of envelope detectors includes a plurality of diode-based detectors. The frequency detector may further include an analog to digital converter connected to the at least one voltage comparator and configured to convert the output signal from the at least one voltage compactors into a digital signal. In one example the frequency detector further includes a digital decoder connected to the analog to digital converter and configured to provide the impedance control signal/information based on the digital signal received from the analog to digital converter. The frequency detector may further include a digital inverter connected to an output of the at least one voltage comparator.

According to another embodiment an electromagnetic coupler system comprises an electromagnetic coupler having an input port, an output port, a coupled port, and an isolation port, the electromagnetic coupler including a main transmission line extending between the input port and the output port, and a coupled transmission line extending between the coupled port and the isolation port, and the electromagnetic coupler being configured to produce a coupled signal at the coupled port responsive to receiving an input signal at the input port. The electromagnetic coupler system further includes an adjustable termination impedance connected to the isolation port, a frequency detector connected to the coupled port and configured to determine a frequency of the coupled signal and provide an indicator of the frequency of the coupled signal, and a controller connected to the frequency detector and the adjustable termination impedance, the controller being configured to receive the indicator of the frequency of the coupled signal from the frequency detector and to apply a control signal to the adjustable termination impedance to tune the adjustable termination impedance based on the frequency of the coupled signal.

In one example the adjustable termination impedance includes a tunable resistive-capacitive-inductive circuit. In another example the adjustable termination impedance includes a network of switchable impedance elements. The network of switchable impedance elements may include at least two resistive elements. The network of switchable impedance elements may further include at least one capacitive element or at least one inductive element.

In one example the frequency detector includes a plurality of frequency selective components, a corresponding plurality of envelope detectors coupled to the plurality of frequency selective components, and at least one voltage comparator connected to the plurality of envelope detectors and configured to compare outputs of the plurality of envelope detectors and to produce the indicator of the frequency of the coupled signal based on the comparison. In one example the plurality of frequency selective components includes a plurality of bandpass filters, each bandpass filter having a unique frequency passband. In another example the plurality of frequency selective components includes a plurality of narrowband amplifiers. In one example the plurality of envelope detectors includes a plurality of diode-based detectors.

Another embodiment is directed to a coupler module including an example of any of the above-discussed electromagnetic coupler systems. The coupler module may further include a packaging substrate, the electromagnetic coupler system being formed on the packaging substrate, and a plurality of connection pads for connecting the electromagnetic coupler system to external electronic devices.

Another embodiment is directed to a wireless device comprising an example of any one of the above-discussed electromagnetic coupler systems, an antenna coupled to the output port of the electromagnetic coupler, and a transceiver coupled to the input port of the electromagnetic coupler and configured to produce the input signal. The wireless device may further comprise a power amplifier connected between the transceiver and the input port of the electromagnetic coupler, the power amplifier configured to amplify the input signal. In one example the wireless device further comprises a sensor connected to the coupled port of the electromagnetic coupler and configured to receive the coupled signal. In another example the wireless device further comprises an antenna switch module coupled between the output port of the electromagnetic coupler and the antenna, and between the antenna and the transceiver. The wireless device may further comprise a baseband sub-system coupled to the transceiver. In one example the wireless device further comprises at least one of a power management sub-system, a battery, at least one memory, and a user interface.

According to another embodiment an electromagnetic coupler system comprises a bi-directional electromagnetic coupler having a first power signal port, a second power signal port, a third port, and a fourth port, the electromagnetic coupler including a main transmission line extending between the first and second power signal ports, and a coupled transmission line extending between the third and fourth ports. The electromagnetic coupler may be configured to produce, in a forward mode of operation, a forward coupled signal at the third port responsive to receiving an input signal at the first power signal port and to produce, in a reverse mode of operation, a reverse coupled signal at the fourth port responsive to receiving the input signal at the second power signal port. The electromagnetic coupler system further includes a first adjustable termination impedance, a second adjustable termination impedance, and a switch network operable to selectively configure the bi-directional electromagnetic coupler between the forward mode of operation and the reverse mode of operation, to selectively connect the first adjustable termination impedance to the fourth port when the bi-directional electromagnetic coupler is in the forward mode of operation, and to selectively connect the second adjustable termination impedance to the third port when the bi-directional electromagnetic coupler is in the reverse mode of operation. The electromagnetic coupler system further includes a controller configured to control the switch network, and a frequency detector coupled to the third and fourth ports and configured to determine a frequency of the forward coupled signal and the reverse coupled signal and to provide an impedance control signal to tune the first and second adjustable termination impedances based on the frequencies of the forward and reverse coupled signals, respectively.

In one example the frequency detector is configured to provide the impedance control signal to the controller, the controller being further configured to tune the first and second adjustable termination impedances responsive to the impedance control signal.

In one example the controller is configured to receive an input control signal specifying a desired mode of operation of the bi-directional electromagnetic coupler and to actuate the switch network responsive to the input control signal.

In one example, each of the first and second adjustable termination impedances includes a tunable resistive-capacitive-inductive circuit. In another example, each of the first and second adjustable termination impedances includes a network of switchable impedance elements. In one example the network of switchable impedance elements includes at least one resistive element, at least one capacitive element, and at least one inductive element.

The frequency detector may include a plurality of frequency selective components, a corresponding plurality of envelope detectors coupled to the plurality of frequency selective components, and at least one voltage comparator connected to the plurality of envelope detectors and configured to compare outputs of the plurality of envelope detectors and to produce an output signal responsive to the comparison, the frequency detector being further configured to provide the impedance control signal based on the output signal from the at least one voltage comparator. In one example the plurality of frequency selective components includes a plurality of bandpass filters, each bandpass filter having a unique frequency passband. In another example the plurality of frequency selective components includes a plurality of narrowband amplifiers. In one example the plurality of envelope detectors includes a plurality of diode-based detectors. The frequency detector may further include an analog to digital converter connected to the at least one voltage comparator and configured to convert the output signal from the at least one voltage compactors into a digital signal. In one example the frequency detector further includes a digital decoder connected to the analog to digital converter and configured to provide the impedance control signal based on the digital signal received from the analog to digital converter.

Another embodiment is directed to a coupler module comprising the electromagnetic coupler system.

Another embodiment is directed to a wireless device comprising the coupler module. The wireless device may further comprise a transceiver, and an antenna, the coupler module being coupled between the antenna and the transceiver.

According to another embodiment a wireless device comprises an example of the electromagnetic coupler system including the bi-directional electromagnetic coupler, a transceiver coupled to the first power signal port of the bi-directional electromagnetic coupler, and an antenna coupled to the second power signal port of the bi-directional electromagnetic coupler. The wireless device may further comprise a sensor selectively connected to the third port and the fourth port of the bi-directional electromagnetic coupler, the sensor being configured to receive the forward coupled signal when the bi-directional electromagnetic coupler is operated in the forward mode of operation, and to receive the reverse coupled signal when the bi-directional electromagnetic coupler is operated in the reverse mode of operation. In one example the wireless device further comprises a power amplifier coupled between the transceiver and the first power signal port of the bi-directional electromagnetic coupler. In another example the wireless device further comprises an antenna switch module coupled between the second power signal port of the bi-directional electromagnetic coupler and the antenna, and between the antenna and the transceiver. In another example the wireless device further comprises at least one of a baseband sub-system, a power management sub-system, a user interface, at least one memory, and a battery.

According to another embodiment, a self-adjusting electromagnetic coupler system comprises a bi-directional electromagnetic coupler having a first power signal port, a second power signal port, a third port, and a fourth port, the electromagnetic coupler including a main line extending between the first and second power signal ports, and a coupled line extending between the third and fourth ports, and the electromagnetic coupler being configured to produce, in a forward mode of operation, a forward coupled signal at the third port responsive to receiving a first signal at the first power signal port and to produce, in a reverse mode of operation, a reverse coupled signal at the fourth port responsive to receiving a second signal at the second power signal port. The self-adjusting electromagnetic coupler system further comprises at least one adjustable termination impedance, and a switch network operable to selectively configure the bi-directional electromagnetic coupler between the forward mode of operation and the reverse mode of operation, and to selectively connect the at least one adjustable termination impedance to the fourth port when the bi-directional electromagnetic coupler is in the forward mode of operation and to the third port when the bi-directional electromagnetic coupler is in the reverse mode of operation. The self-adjusting electromagnetic coupler system further comprises a controller configured to control the switch network, and a frequency detector configured to determine frequencies of the forward coupled signal and the reverse coupled signal and to provide impedance control information to tune the at least one adjustable termination impedance based on the frequencies of the forward and reverse coupled signals, the switch network being further configured to selectively connect the frequency detector to the third port when the bi-directional electromagnetic coupler is in the forward mode of operation and to the fourth port when the bi-directional electromagnetic coupler is in the reverse mode of operation.

In one example the at least one adjustable termination impedance includes a first adjustable termination impedance and a second adjustable termination impedance, the switch network being configured to selectively connect the first adjustable termination impedance to the fourth port when the bi-directional electromagnetic coupler is in the forward mode of operation, and to selectively connect the second adjustable termination impedance to the third port when the bi-directional electromagnetic coupler is in the reverse mode of operation. The at least one adjustable termination impedance may include a tunable resistive-capacitive-inductive circuit. The at least one adjustable termination impedance may include a network of switchable impedance elements. In one example the network of switchable impedance elements includes at least one resistive element, at least one capacitive element, and at least one inductive element.

In one example the frequency detector is configured to provide the impedance control information to the controller, the controller being further configured to tune the first and second adjustable termination impedances responsive to the impedance control information. In another example the frequency detector is further configured to provide an impedance control signal based on the impedance control information, and to apply the impedance control signal to the at least one adjustable termination impedance to tune the at least one adjustable termination impedance.

In one example the frequency detector includes a plurality of frequency selective components, a corresponding plurality of envelope detectors coupled to the plurality of frequency selective components, and at least one voltage comparator connected to the plurality of envelope detectors and configured to compare outputs of the plurality of envelope detectors and to produce an output signal responsive to the comparison, the frequency detector being further configured to provide the impedance control information based on the output signal from the at least one voltage comparator. In one example the plurality of frequency selective components includes a plurality of bandpass filters, each bandpass filter having a unique frequency passband. In another example the plurality of frequency selective components includes a plurality of narrowband amplifiers. The plurality of envelope detectors may include a plurality of diode-based detectors. The frequency detector may further include an analog to digital converter connected to the at least one voltage comparator and configured to convert the output signal from the at least one voltage compactors into a digital signal. In one example the frequency detector further includes a digital decoder connected to the analog to digital converter and configured to provide the impedance control information based on the digital signal received from the analog to digital converter.

According to another embodiment a self-adjusting electromagnetic coupler assembly comprises an electromagnetic coupler having an input port, an output port, a coupled port, and an isolation port, the electromagnetic coupler including a main line extending between the input port and the output port, and a coupled line extending between the coupled port and the isolation port, the electromagnetic coupler being configured to produce a coupled signal at the coupled port responsive to receiving an input signal at the input port, an adjustable termination impedance connected to the isolation port, and a frequency detector connected to the coupled port and configured to detect a frequency of the coupled signal and to provide impedance control information to tune the adjustable termination impedance based on the frequency of the coupled signal.

In one example the adjustable termination impedance includes a tunable resistive-capacitive-inductive circuit. In another example the adjustable termination impedance includes a network of switchable impedance elements. The network of switchable impedance elements may include at least one resistive element, at least one capacitive element, and at least one inductive element.

In one example the self-adjusting electromagnetic coupler assembly further comprises a controller coupled to the frequency detector and configured to receive the impedance control information from the frequency detector, to produce an impedance control signal based on the impedance control information, and to apply the impedance control signal to the adjustable termination impedance to tune the adjustable termination impedance.

In another example the electromagnetic coupler is a bi-directional electromagnetic coupler configured to produce, in a forward mode of operation, the coupled signal at the coupled port and to produce, in a reverse mode of operation, a reverse coupled signal at the isolation port. The self-adjusting electromagnetic coupler assembly may further comprise a switch network operable to selectively configure the bi-directional electromagnetic coupler between the forward mode of operation and the reverse mode of operation. In one example the switch network is further configured to selectively connect the adjustable termination impedance to the isolation port when the bi-directional electromagnetic coupler is in the forward mode of operation, and to selectively connect the adjustable termination impedance to the coupled port when the bi-directional electromagnetic coupler is in the reverse mode of operation. The self-adjusting electromagnetic coupler assembly may further comprise an additional adjustable termination impedance, the switch network being configured to selectively connect the adjustable termination impedance to the isolation port when the bi-directional electromagnetic coupler is in the forward mode of operation, and to selectively connect the additional adjustable termination impedance to the coupled port when the bi-directional electromagnetic coupler is in the reverse mode of operation. In one example the self-adjusting electromagnetic coupler assembly further comprises a controller configured to control the switch network. The controller may be coupled to the frequency detector and further configured to receive the impedance control information from the frequency detector, to produce an impedance control signal based on the impedance control information, and to apply the impedance control signal to the adjustable termination impedance to tune the adjustable termination impedance.

In one example the frequency detector includes a plurality of frequency selective components, a corresponding plurality of envelope detectors coupled to the plurality of frequency selective components, and at least one voltage comparator connected to the plurality of envelope detectors and configured to compare outputs of the plurality of envelope detectors and to produce an output signal responsive to the comparison, the frequency detector being further configured to provide the impedance control information based on the output signal from the at least one voltage comparator. In one example the plurality of frequency selective components includes a plurality of bandpass filters, each bandpass filter having a unique frequency passband. In another example the plurality of frequency selective components includes a plurality of narrowband amplifiers. The plurality of envelope detectors may include a plurality of diode-based detectors. In one example the frequency detector further includes an analog to digital converter connected to the at least one voltage comparator and configured to convert the output signal from the at least one voltage compactors into a digital signal. In another example the frequency detector further includes a digital decoder connected to the analog to digital converter and configured to provide the impedance control information based on the digital signal received from the analog to digital converter. The frequency detector may be further configured to provide an impedance control signal based on the impedance control information, and to apply the impedance control signal to the adjustable termination impedance to tune the adjustable termination impedance.

Another embodiment is directed to a coupler module comprising a packaging substrate, and an electromagnetic coupler formed on the packaging substrate. The electromagnetic coupler having an input port, an output port, a coupled port, and an isolation port, the electromagnetic coupler including a main line extending between the input port and the output port, and a coupled line extending between the coupled port and the isolation port, the electromagnetic coupler being configured to produce a coupled signal at the coupled port responsive to receiving an input signal at the input port. The coupler module further comprises an adjustable termination impedance connected to the isolation port, and a frequency detector mounted on the packaging substrate connected to the coupled port and configured to detect a frequency of the coupled signal and to provide impedance control information to tune the adjustable termination impedance based on the frequency of the coupled signal.

In one example the packaging substrate is a laminate substrate including a first metal layer, a second metal layer, and a dielectric layer interposed between the first and second metal layers, the mail line of the electromagnetic coupler being formed in the first metal layer and the coupled line of the electromagnetic coupler being formed in the second metal layer. In another example the packaging substrate is a laminate substrate including at least one metal layer and at least one dielectric layer, the main line and the coupled line of the electromagnetic coupler being formed in the at least one metal layer of the laminate substrate. The coupler module may further comprise a controller mounted on the packaging substrate and connected to the frequency detector.

According to another embodiment a coupler module comprises a packaging substrate, and an electromagnetic coupler assembly die mounted on the packaging substrate. The electromagnetic coupler assembly die includes an electromagnetic coupler having an input port, an output port, a coupled port, and an isolation port, an adjustable termination impedance connected to the isolation port, and a frequency detector connected to the coupled port, the electromagnetic coupler further having a main line extending between the input port and the output port, and a coupled line extending between the coupled port and the isolation port, the electromagnetic coupler being configured to produce a coupled signal at the coupled port responsive to receiving an input signal at the input port, and the frequency detector being configured to detect a frequency of the coupled signal and to provide impedance control information to tune the adjustable termination impedance based on the frequency of the coupled signal. The coupler module further includes a plurality of connection pads for connecting the electromagnetic coupler assembly to external electronic devices.

In one example the electromagnetic coupler assembly die further includes a controller connected to the frequency detector and to the adjustable termination impedance, the controller being configured to receive the impedance control information from the frequency detector, to produce an impedance control signal based on the impedance control information, and to apply the impedance control signal to the adjustable termination impedance to tune the adjustable termination impedance. The coupler module may further comprise a controller die mounted on the packaging substrate and connected to the electromagnetic coupler assembly die, the controller die including a controller configured to receive the impedance control information from the frequency detector, to produce an impedance control signal based on the impedance control information, and to apply the impedance control signal to the adjustable termination impedance to tune the adjustable termination impedance.

According to another embodiment a wireless device comprises a transceiver configured to produce a transmit signal, a power amplifier configured to receive the transmit signal from the transceiver and to amplify the transmit signal to provide a first signal, and an electromagnetic coupler assembly. The electromagnetic coupler assembly includes an electromagnetic coupler having an input port, an output port, a coupled port, and an isolation port, an adjustable termination impedance connected to the isolation port, and a frequency detector connected to the coupled port. The electromagnetic coupler further has a main line extending between the input port and the output port, and a coupled line extending between the coupled port and the isolation port, the power amplifier being connected to the input port of the electromagnetic coupler. The electromagnetic coupler is configured to produce a coupled signal at the coupled port responsive to receiving the first signal at the input port. The frequency detector is configured to detect a frequency of the coupled signal and to provide impedance control information to tune the adjustable termination impedance based on the frequency of the coupled signal. In one example the wireless device further comprises an antenna coupled to the output port of the electromagnetic coupler. The wireless device may further comprise an antenna switch module coupled between the output port of the electromagnetic coupler and the antenna, and between the antenna and the transceiver. In one example the wireless device further comprises a sensor connected to the coupled port of the electromagnetic coupler and configured to detect the coupled signal. The wireless device may further comprise at least one of a baseband sub-system, a power management sub-system, a user interface, and at least one memory.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIG. 4A is a diagram illustrating one example of an adjustable termination impedance;

FIG. 4B is a diagram illustrating another example of an adjustable termination impedance;

DETAILED DESCRIPTION

In electromagnetic (EM) couplers, including RF couplers, the termination impedance on the isolation port plays an important role in controlling the directivity of the coupler. As discussed above, in conventional RF couplers, termination impedance is typically at a fixed impedance value, which provides a desired directivity for only a particular range of frequencies. Thus, when the coupler is operating in a different frequency band outside of the particular range of frequencies, directivity will not be optimized. Accordingly, if the EM coupler is intended to be used over multiple frequency bands, for example, it is preferable to use an adjustable termination impedance. Adjusting the termination impedance electrically connected to the isolation port of the EM coupler can improve the directivity of the EM coupler by providing a desired termination impedance for particular operating conditions, such as the frequency band of the signal to be measured by the EM coupler or a power mode of an electronic system that includes the EM coupler.

Figure 1:
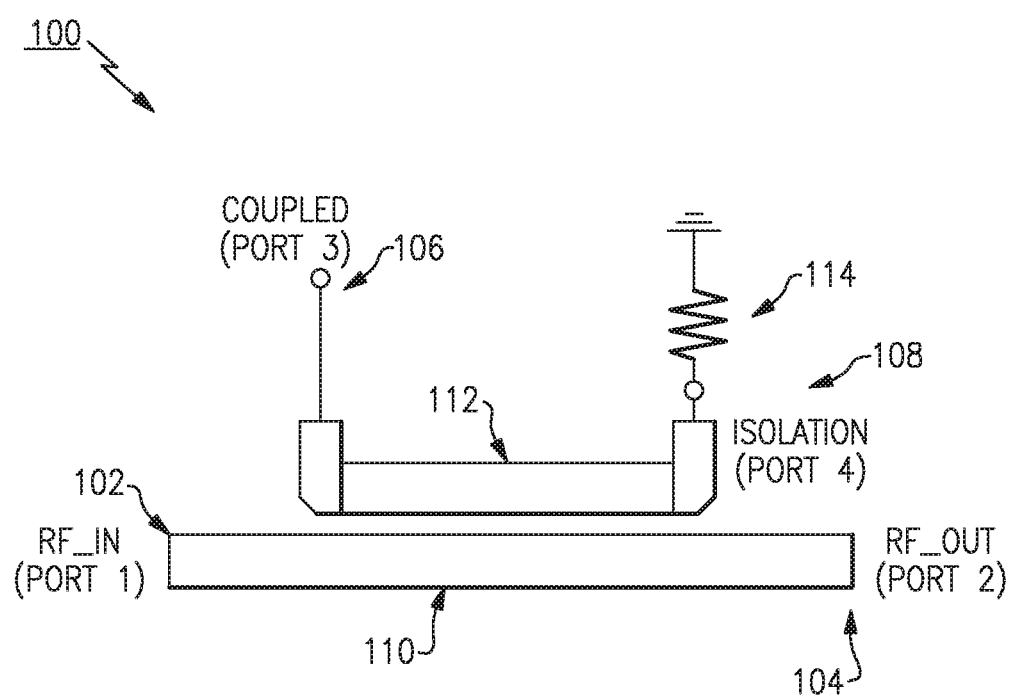
FIG. 1 is a block diagram of an example of an electromagnetic coupler.
Figure 2A:
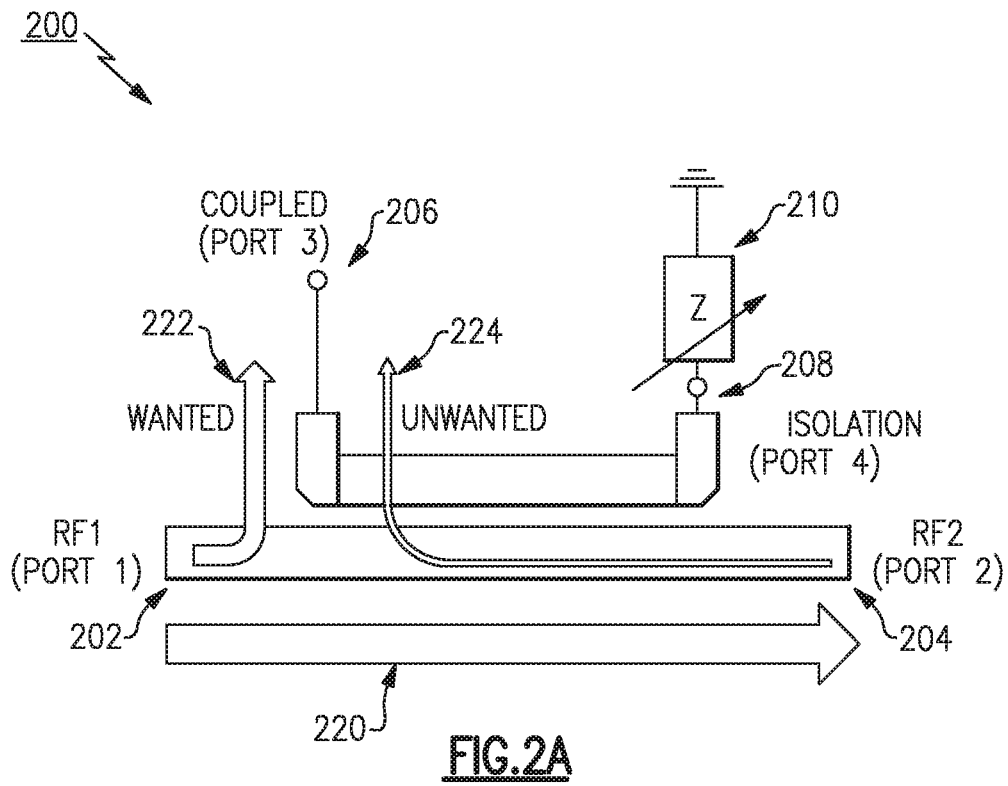
FIG. 2A is a diagram illustrating an example of an electromagnetic coupler configured for forward power detection.
Figure 2B:
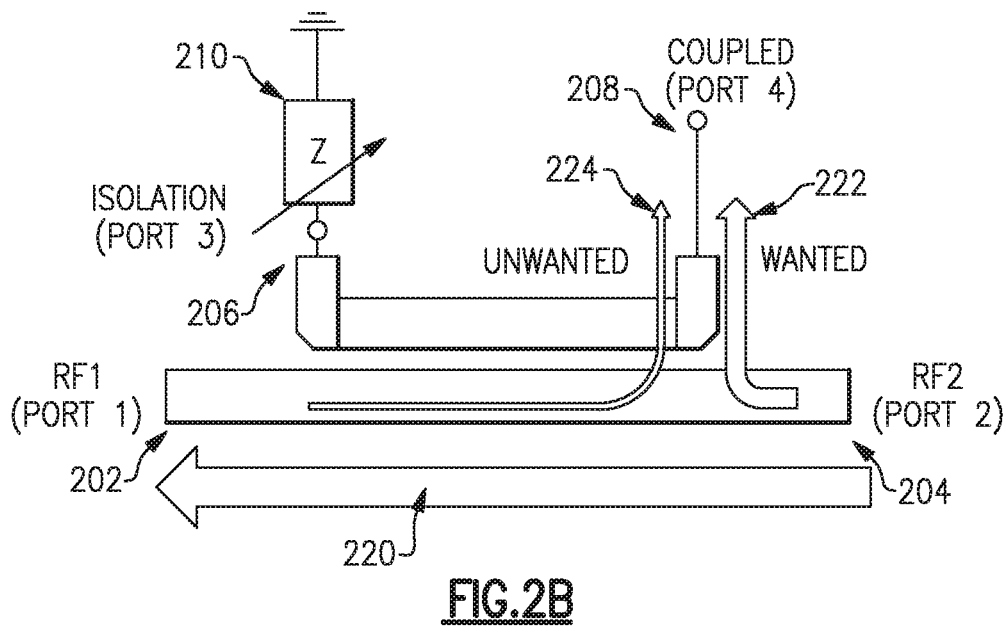
FIG. 2B is a diagram illustrating the electromagnetic coupler configured for reverse power detection.

Referring to FIGS. 2A and 2B, there is illustrated an example of a bidirectional EM coupler 200 having an adjustable termination impedance 210. FIG. 2A shows the EM coupler 200 configured for forward power measurement. In this configuration, it is desired that the EM coupler 200 measure the power in a signal 220 travelling from a first power port 202 to a second power port 204. Accordingly, a third port 206 of the EM coupler 200 acts at the coupled port, and the adjustable termination impedance 210 is connected to a fourth port 208, which acts as the isolation port. FIG. 2B illustrates the opposite arrangement in which the EM coupler 200 is configured for reverse power measurement and the signal 220 to be measured travels from the second power port 204 to the first power port 202. In this configuration, the adjustable termination impedance 210 is connected to the third port 206, which acts as the isolation port, and the measurement occurs at the fourth port 208, which acts as the coupled port. In the reverse power measurement configuration of the EM coupler 200, the signal 220 may be a reflection of part of a signal input at the first power port 202, or may be a signal received and input at the second power port 204.

The directivity of the EM coupler 200 influences the ability of the EM coupler to detect the desired signal 222 at the coupled port and reject unwanted signals 224 that could degrade the measurement sensitivity or accuracy at the coupled port. The higher the directivity, the better. For the forward power measurement configuration shown in FIG. 2A, the directivity (D) of the EM coupler is given, in dB, by:

$$D_{3,4} = -10\log\left(\frac{P_4}{P_3}\right) = -10\log\left(\frac{P_4}{P_1}\right) + 10\log\left(\frac{P_3}{P_1}\right) \quad (1)$$

In Equation (1), $P_n$ is the power at coupler port n. In S-parameters, this can be written as:

directivity (dB)=$S(3,1)$ in dB–$S(3,2)$ in dB  (2)

For the reverse power measurement configuration shown in FIG. 2B, the directivity is given by:

directivity (dB)=$S(4,2)$ in dB–$S(4,1)$ in dB  (3)

As discussed above, the directivity of the EM coupler 200 is frequency dependent, and dependent on the termination impedance 210 provided to the isolation port. It is highly desirable to have the directivity of the EM coupler 200 be as high as possible at all operating frequencies or frequency ranges of the coupler. Adjusting or tuning the termination impedance 210 can improve the directivity of the EM coupler 200 as the frequency (or frequency band) of the signal 222 changes.

Figure 3A:
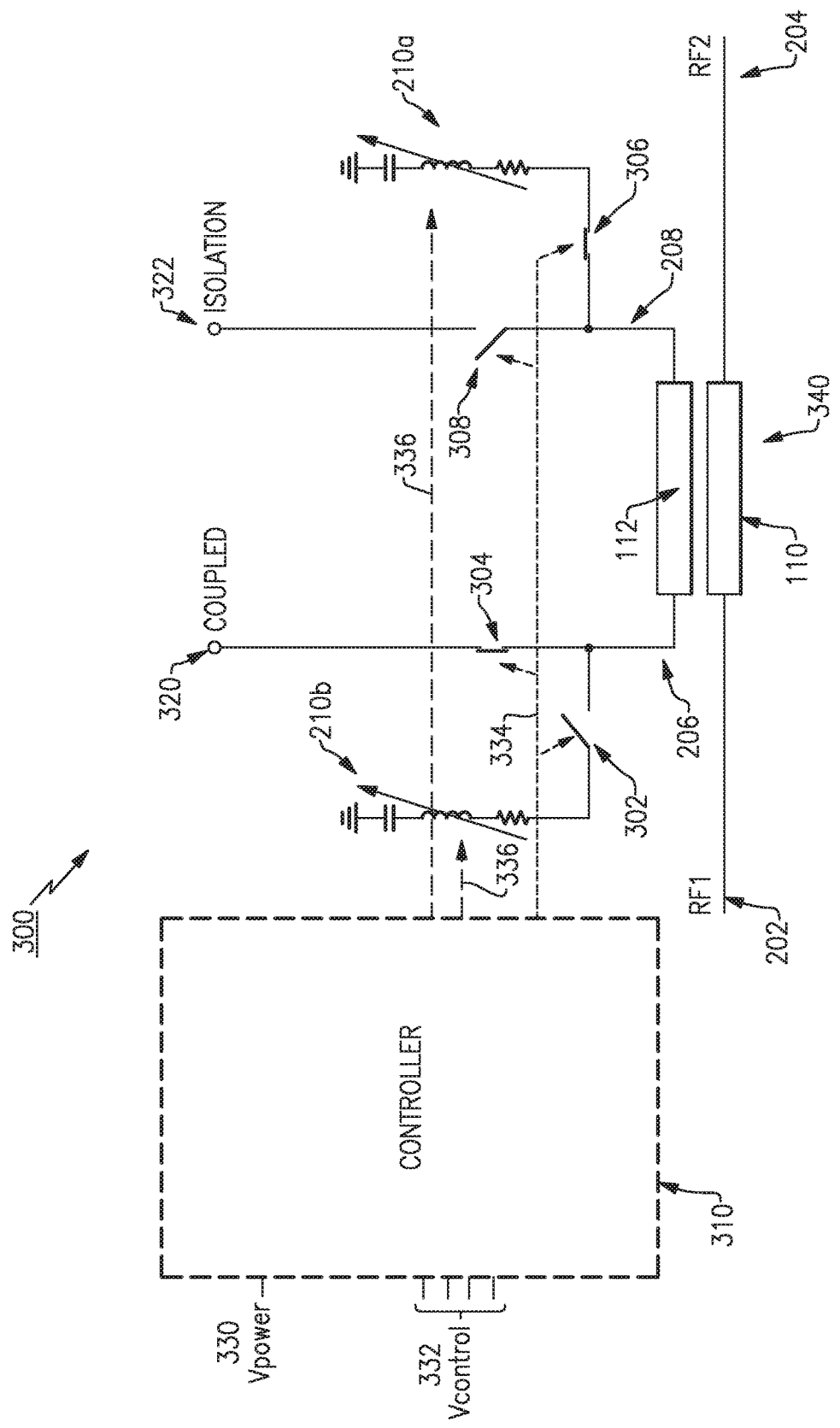
FIG. 3A is diagram of one example of a bidirectional electromagnetic coupler having an adjustable termination impedance.

There are a variety of ways in which the adjustable termination impedance 210 can be implemented and adjusted. For example, referring to FIG. 3A, there is illustrated an example of a bi-directional EM coupler system 300 including a controller 310 that controls the mode of operation (forward or reverse power detection) of the coupler and the value of adjustable termination impedances 210a or 210b presented at the isolation port. In this example the EM coupler system 300 includes a set of mode-select switches 302, 304, 306, 308 that, under control of the controller 310, selectively configure the EM coupler 340 for either forward or reverse power detection. In FIG. 3A, the EM coupler 340 is shown configured in the forward mode. Mode-select switches 304 and 306 are closed, respectively connecting the third port 206 to a coupled port measurement contact 320 and the fourth port 208 to the adjustable termination impedance 210a. Mode-select switches 302 and 308 are open. For reverse power measurement, mode-select switches 304 and 306 can be opened, and mode-select switches 302 and 308 closed to respectively connect the third port 206 to the adjustable termination impedance 210b and the fourth port 208 to another measurement contact 322.

The controller 310 receives a power signal 330 from a power supply (not shown), such as a battery, for example. The controller 310 further receives an input control signal 332 that specifies various operating parameters of the EM coupler 340, such as desired mode of the coupler and the input frequency of the signal 220 to be measured. As will be appreciated by those skilled in art, the signal 220 may represent an individual carrier frequency, or may represent a range of frequencies, or one or more bands of frequencies. As used herein, the term "input frequency" in the context of a signal to be measured by the EM coupler is intended to refer to a signal comprised of a single carrier frequency or having a certain, typically relatively narrow, bandwidth covering a range of frequencies. The controller 310 provides a set of mode-control signals 334 to actuate the mode-select switches 302, 304, 306, and 308 to configure the EM coupler for either forward or reverse power measurement, and a set of impedance control signals 336 to tune the connected one of the adjustable termination impedances 201a or 210b (adjustable termination impedance 210a in the example shown in FIG. 3A) based on the input frequency information.

Figure 3B:
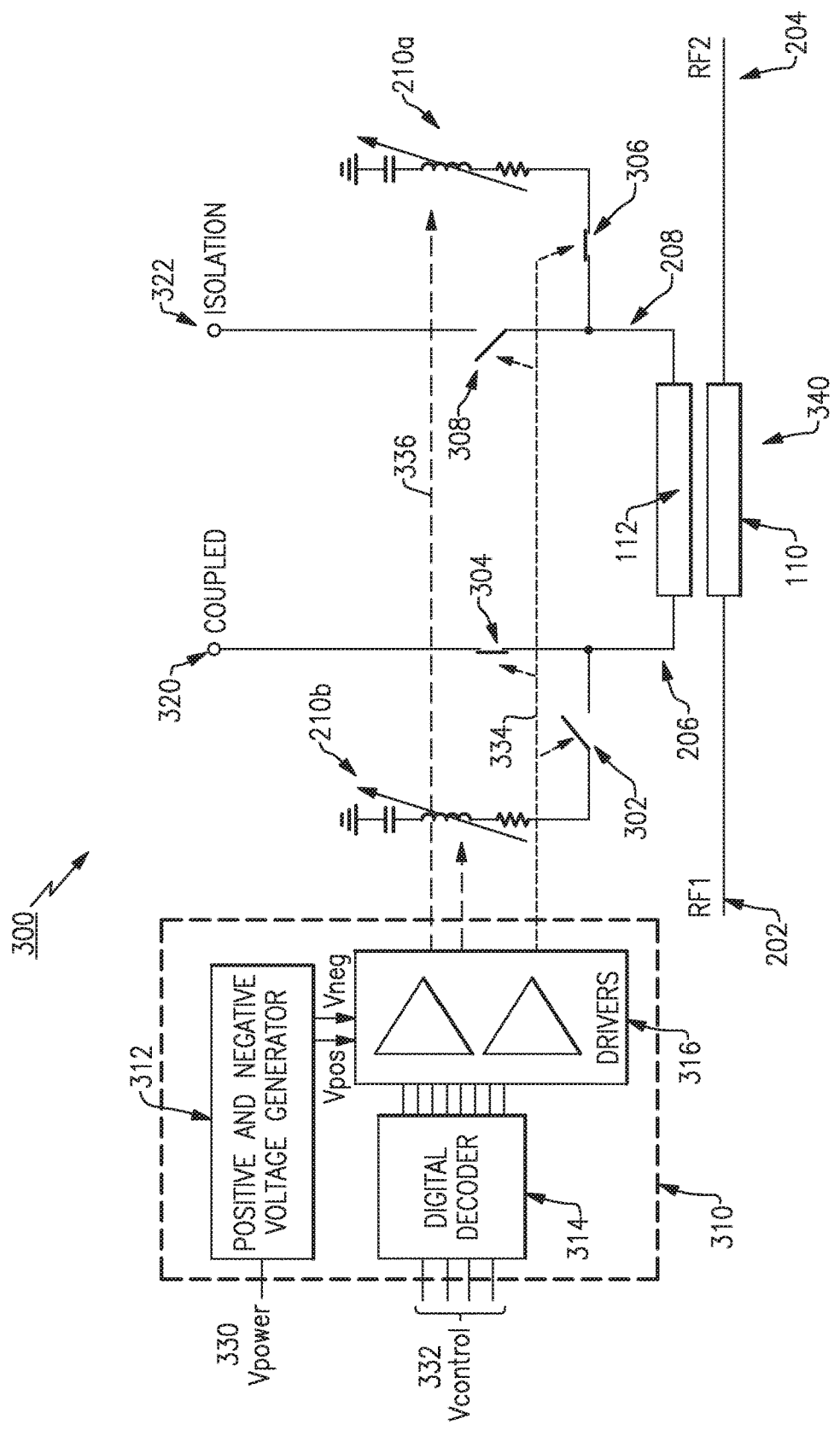
FIG. 3B is a diagram of the bidirectional electromagnetic coupler of FIG. 3A showing an example of the controller.

FIG. 3B illustrates one example of the controller 310 in which the controller includes a voltage generator 312, a digital decoder 314, and a set of drivers 316. In this example, the voltage generator 312 receives the power signal 330. The voltage generator 312 can be a positive and negative voltage generator, and produces voltages (e.g., Vpos and Vneg as shown in FIG. 3) to power the drivers 316. The digital decoder 314 decodes the incoming input control signal 332, and controls the drivers 316 to provide the mode-control signals 334 and impedance control signals 336.

In FIGS. 3A and 3B, the adjustable termination impedances 210a, 210b are shown as adjustable/tunable RLC (resistive-inductive-capacitive) circuits, which may include any one or more tunable resistive, inductive, or capacitive elements, or a combination thereof. However, given the benefit of this disclosure, those skilled in the art will appreciate that the adjustable termination impedances 210 can be implemented in a variety of different ways. For example, in certain embodiments, a switch network can selectively electrically couple different termination impedances to the isolation port responsive to the impedance control signals 336.

FIG. 4A illustrates one such example, in which the adjustable termination impedance 210 includes a plurality of impedances 212, and the associated mode-select switch (302 or 306) includes a corresponding plurality of switches 214, each operable to electrically connect a respective one of the impedances 212 to the isolation port of the EM coupler. Responsive to one or more impedance control signals 336, any one or more the switches 214 can be closed to electrically connect any combination of one or more of the impedances 212 to the isolation port of the EM coupler, thereby presenting a desired impedance value at the isolation port. Each of the impedances 212 can include one or more fixed resistive, capacitive, or inductive elements, or any combination thereof.

Figure 4C:
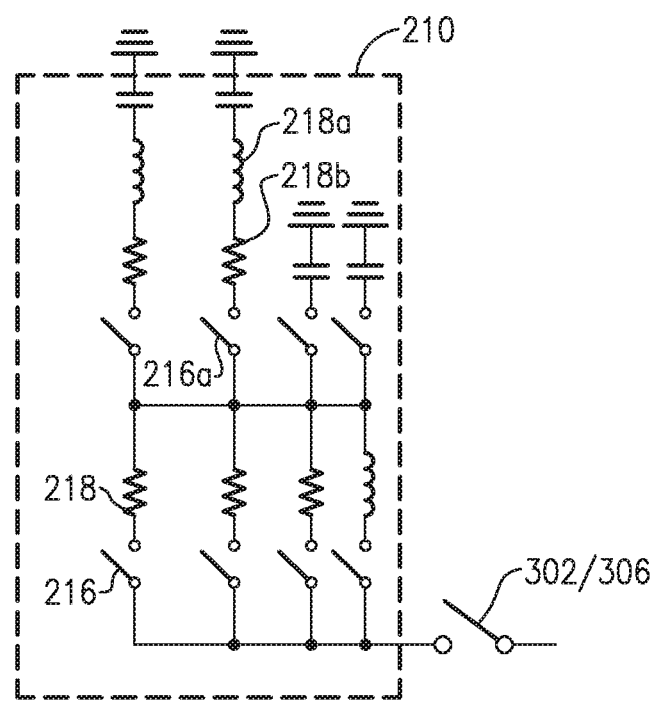
FIG. 4C is a diagram illustrating another example of an adjustable termination impedance.

In the example shown in FIG. 4A, the switches 214 are positioned between the associated port of the EM coupler 340 and each of the impedances 212. FIG. 4B illustrates another configuration, in which the adjustable termination impedance 210 includes a network of individually switchable impedance (resistive, capacitive, and inductive) elements 218, each having an associated switch 216. FIG. 4C illustrates another example in which some impedance elements are grouped (e.g., elements 218a and 218b) and associated with a single impedance switch 216a, rather than every impedance element being individually switched, as shown in FIG. 4B. Responsive to one or more impedance control signals 336, any one or more the switches 216 can be closed to electrically connect any combination of one or more of the switchable impedance elements to the isolation port of the EM coupler, thereby presenting a desired impedance value at the isolation port. Although the switchable impedance elements are shown in FIGS. 4B and 4C as fixed resistive, capacitive, and inductive elements, any one or more of the impedance elements may be tunable (responsive to an impedance control signal 336) as well as switchable.

Using an adjustable termination impedance 210 can improve the directivity of the EM coupler across multiple frequency bands as the termination impedance can be optimized for different frequencies. However, for proper operation, the controller 310 needs frequency information (e.g., logic states included in the input control signal 332 that define the frequency band of operation or indicate the impedance value to be used) to be able to actuate the impedance switches 214 or 216, or otherwise tune the adjustable impedance 210, so that the best impedance value with which to terminate the isolation port is provided.

In certain circumstances, the EM coupler may not be provided with frequency band information. For example, when received from an external component (i.e., external to the EM coupler), the input control signal 332 may not include the input frequency information, and therefore in such circumstances the controller 310 cannot change the value of the termination impedance 210 according to the frequency band of operation.

For such circumstances, aspects and embodiments can provide the EM coupler 340 with an integrated mechanism by which to automatically determine the input frequency information, which can then be used to optimize the adjustable termination impedance and the directivity of the coupler, without having to rely on receiving the frequency information from an outside source. The intrinsic operation of the EM coupler 340 includes extracting (by electromagnetic coupling) a portion of the signal 220 from the main line 110 and providing the coupled signal at the coupled port. According to certain embodiments, the coupled signal can be used to extract frequency information, which can then be used to select or adjust the termination impedance 210. For example, as discussed further below, a frequency detection circuit can be connected to the coupled port, and can provide information or control signals that can be used to adjust the termination impedance 210 at the isolation port.

Figure 5:
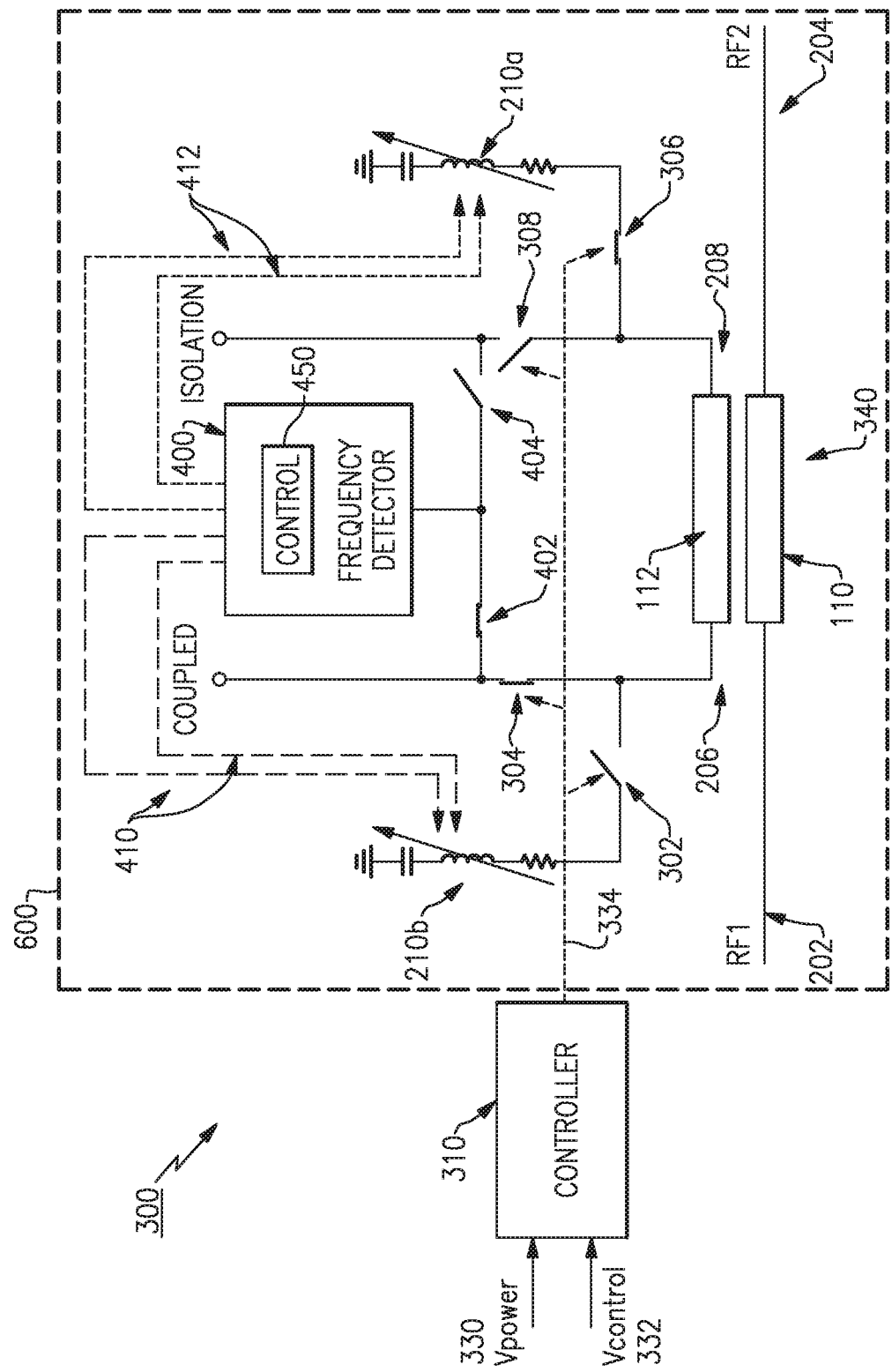
FIG. 5 is a diagram of one example of a self-adjusting bidirectional electromagnetic coupler having an adjustable termination impedance and integrated frequency detection circuit.

Referring to FIG. 5 there is illustrated one example of an EM coupler system 300 including a frequency detection circuit 400 that can be selectively connected to the third and fourth ports 206, 208 of the EM coupler 340, optionally depending on the mode of operation of the coupler to provide a self-adjusting EM coupler assembly 600. For example, frequency detection switches 402 and 404 can be used to respectively connect the frequency detection circuit 400 to the third port 206 when the coupler is operating in the forward power detection mode (as shown in FIG. 5) or to the fourth port 208 when the coupler is operating in the reverse power detection mode. In this manner the frequency detection circuit 400 can be connected to the coupled port of the coupler and function to detect the frequency of the coupled signal. Based on the detected frequency of the coupled signal, the frequency detection circuit can provide impedance control signals 410 and 412 to adjust the termination impedances 210b and 210a, respectively. In certain examples the frequency detection switches 402 and 404 can be operated in conjunction with the mode-select switches 302, 304, 306, and 308. Both frequency detection switches 402, 404 can be open to completely disconnect the frequency detection circuit should no frequency detection be needed or desired at a given time. In the example shown in FIG. 5, the frequency detection circuit 400 provides the control signals 410, 412 directly to the adjustable termination impedances 210a, 210b. Accordingly, the frequency detector 400 includes control circuitry 450 configured to produce the impedance control signals 410, 412 to appropriately adjust the termination impedances 210a, 210b based on the detected frequency of the coupled signal.

Figure 6:
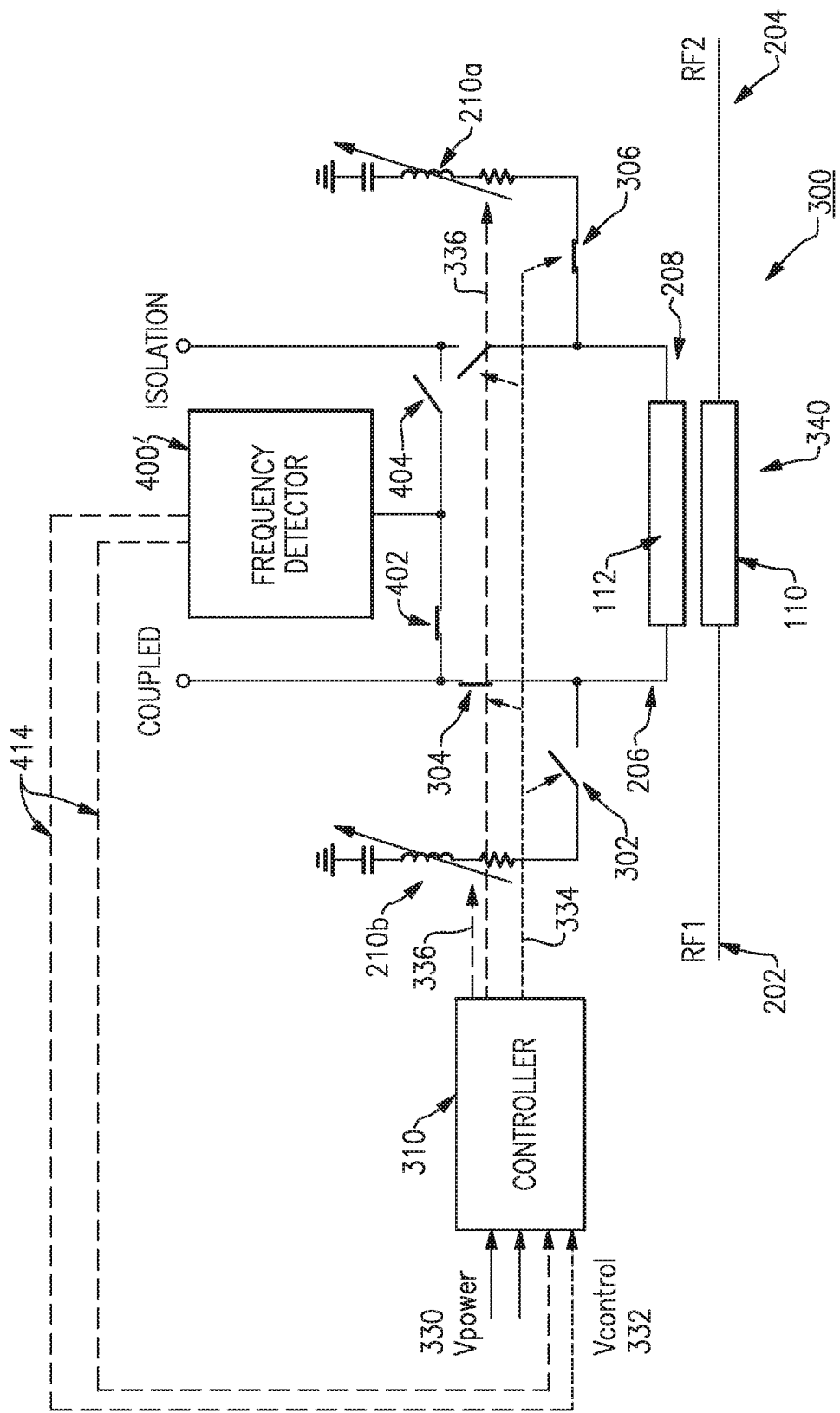
FIG. 6 is a diagram of another example of a self-adjusting bidirectional electromagnetic coupler having an adjustable termination impedance and integrated frequency detection circuit.

Referring to FIG. 6, in another embodiment, the frequency detection circuit 400' can provide frequency information (in the form of signals 414) to the controller 310, which can then use the frequency information to adjust the termination impedances 210a, 210b via impedance control signals 336, as discussed above. In one such example, the input control signal 332 can include both the signals 414 from the frequency detection circuit and one or more information-containing signal(s) from an external source (e.g., specifying the mode of operation or other parameters of the coupler).

Figure 7:
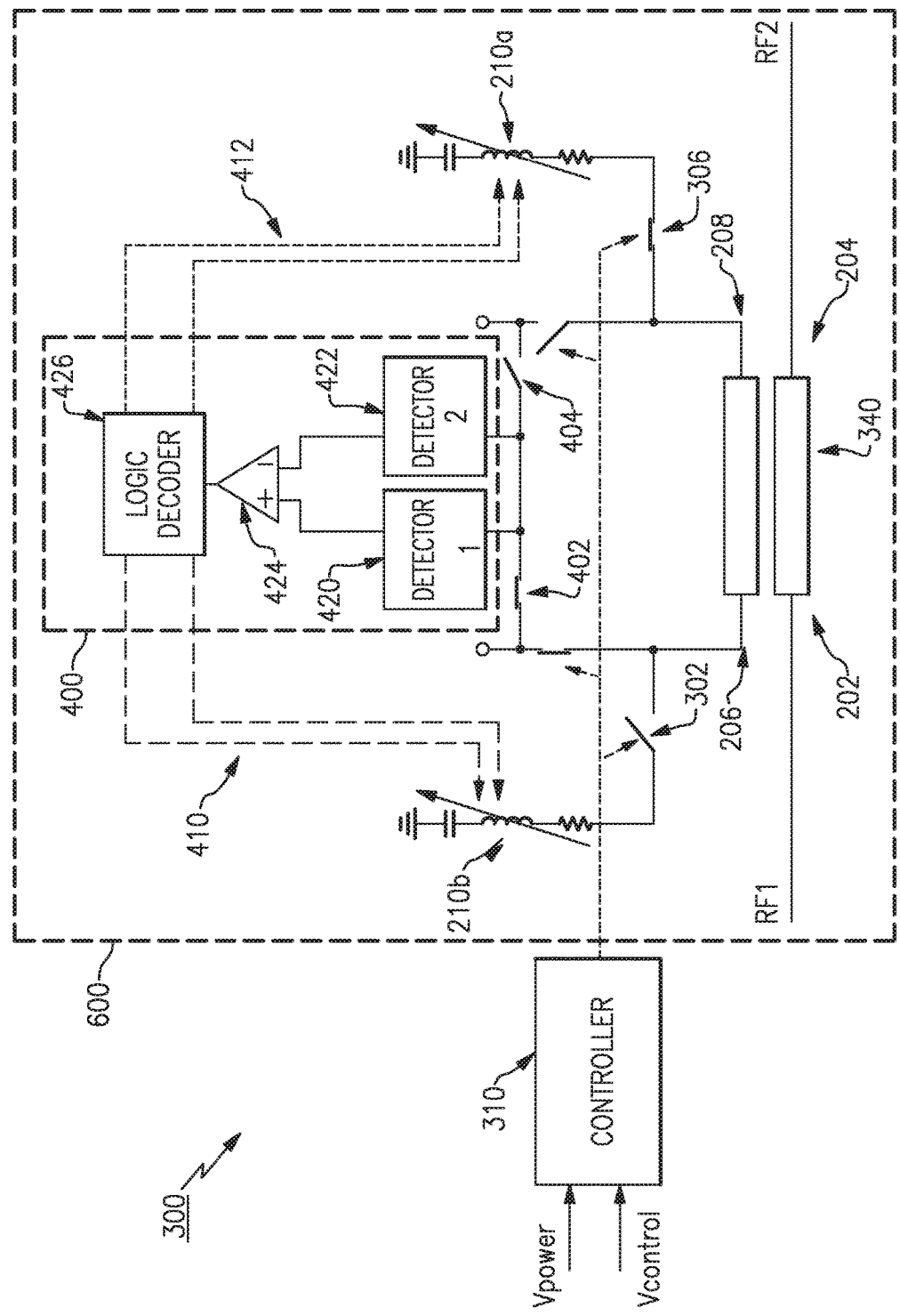
FIG. 7 is a diagram of an example of a self-adjusting bidirectional electromagnetic coupler having an adjustable termination impedance and integrated frequency detection circuit, showing one example of the integrated frequency detection circuit.

The frequency detection circuit can be implemented in a variety of ways. For example, referring to FIG. 7, the frequency detection circuit 400 may include envelope detectors 420, 422 that are selectively electrically connected to either the third port 206 or the fourth port 208 of the EM coupler 340 (depending on the mode of operation of the coupler) by the frequency detection switches 402, 404. Each of the envelope detectors 420, 422 can be configured to detect the coupled signal within a specified frequency range. In the illustrated example, the frequency detection circuit includes two envelope detectors 420, 422; however, those skilled in the art will appreciate that more than two envelope detectors can be included, depending on, for example, the configuration (e.g., frequency responsiveness) of the envelope detectors and the number of different frequency bands or ranges over which the EM coupler is expected to operate. Optionally, one or more amplifiers can be used (not shown in FIG. 7) to amplify the coupled signal prior to its being input to the envelope detectors 420, 422. The outputs from the envelope detectors 420, 422 are provided to a decision circuit that, based on those outputs, either determines the desired impedance value for the adjustable termination impedance 210a or 210b (depending on the mode of operation of the coupler) and provides the control signals 410 or 412 to the adjustable termination impedance 210a or 210b (as shown in FIG. 7), or provides frequency information in signals 414 to the controller 310, as discussed above. In the example shown in FIG. 7, the decision circuit includes a voltage comparator 424 and a digital logic decoder 426; however, those skilled in the art will appreciate that the decision circuit can be implemented in a variety of other ways. Further, in certain examples the frequency detection circuit 400 can include a sample-and-hold memory functionality since frequency detection may typically occur only in the forward-power measurement state, but the control signals for both forward and reverse operating states are dependent on the detected frequency of the coupled signal.

Figure 8:
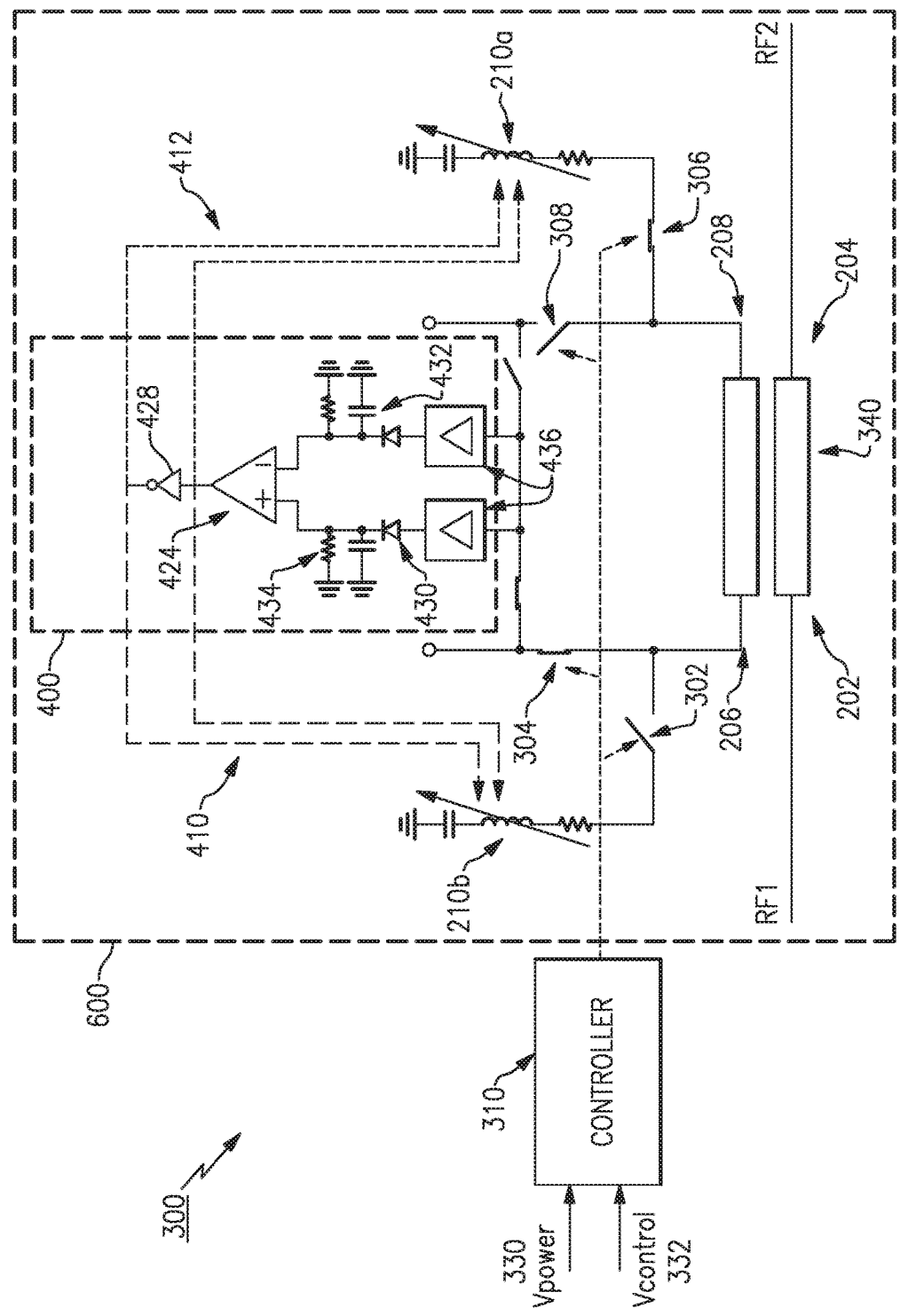
FIG. 8 is a diagram of an example of a self-adjusting bidirectional electromagnetic coupler having an adjustable termination impedance and integrated frequency detection circuit, showing another example of the integrated frequency detection circuit.

Referring to FIG. 8, in one example each of the envelope detectors 420, 422 can be implemented using a diode 430 together with a parallel-connected combination of at least one capacitive element 432 and at least one resistive element 434. In this example the digital logic decoder 426 includes an inverter 428. As discussed above, amplifiers 436 can be included to amplify the coupled signal, if necessary. In certain embodiments, the amplifiers 436 can be designed to be narrow-band in frequency, and therefore perform a frequency selection function as well as amplification. By detecting the magnitude of the signal output from each narrow-band amplifier 436 (using the diode and capacitive-resistive detection circuits formed by elements 430, 432, and 434), and comparing these magnitudes using the voltage comparator 424, a determination of the frequency of the coupled signal can be made and used to adjust the appropriate termination impedance 210a or 210b, as discussed above.

Figure 9:
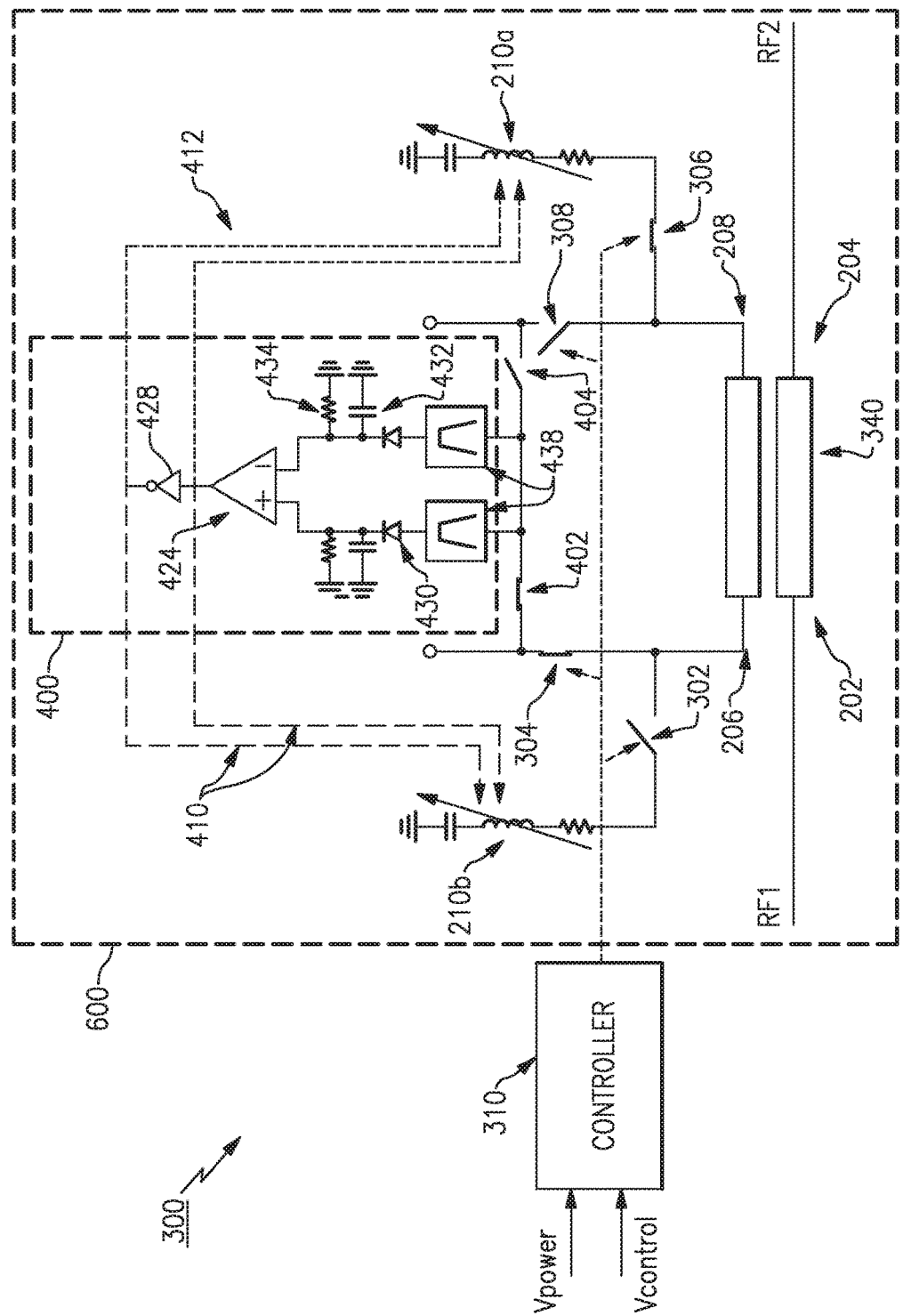
FIG. 9 is a diagram of an example of a self-adjusting bidirectional electromagnetic coupler having an adjustable termination impedance and integrated frequency detection circuit, showing another example of the integrated frequency detection circuit.

FIG. 9 illustrates another example of an implementation of the frequency detection circuit 400. In this example, frequency selection is provided by a plurality of bandpass filters 438. The output of each bandpass filter 438 is provided, via an associated envelope detector (in this example implemented using the combination of a diode 430, capacitive element 432, and resistive element 434, as discussed above), to the voltage comparator 424, and the control signals 410, 412 (or 414) are produced as discussed above.

Figure 10:
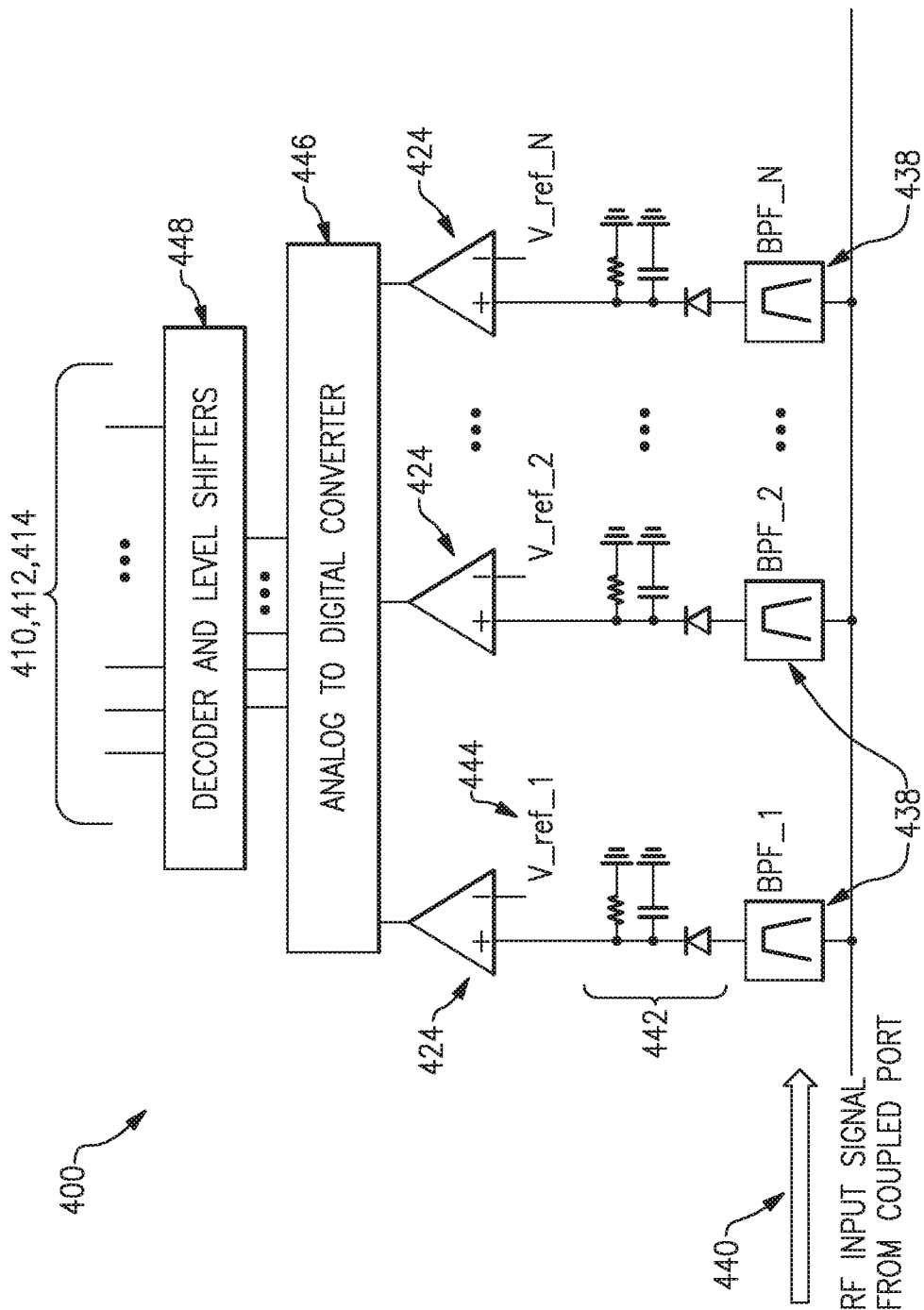
FIG. 10 is a diagram of one example of a multi-band frequency detection circuit for use with a self-adjusting electromagnetic coupler.

The examples shown in FIGS. 7-9 illustrate arrangements for frequency detection of two different frequencies or frequency bands. However, as discussed above, the approach and principles disclosed herein may be readily extended to any number of frequencies or frequency bands. For example, FIG. 10 illustrates an example of the frequency detection circuit 400 extended to N frequencies or frequency bands, N being an integer greater than two, and having a channel or path for each frequency/frequency band. An input signal 440 is received from the coupled port of the associated EM coupler, and processed by the frequency detection circuit 400 to generate one or more of the control signals 410, 412, 414 discussed above. The example illustrated in FIG. 10 includes a bandpass filter 438 for each channel; however, the bandpass filters may be replaced (or supplemented) with narrowband amplifiers, as discussed above, or other frequency selective components. The output from each bandpass filter 438 is provided, via an associated envelope detector 442 (in this example implemented using the combination of a diode 430, capacitive element 432, and resistive element 434, as discussed above), to one input of a respective voltage comparator 424. A reference voltage 444 is provided at the other input of each voltage comparator 424. The reference voltages 444 supplied to each voltage comparator 424 may be the same, or may vary among the different channels. The outputs from the voltage comparators 424 are provided to a multi-channel analog to digital converter 446 that converts the outputs received from any of the voltage comparators 424 into a digital signal. The digital signal is provided to a decoder and level shifting circuit 448 that decodes the digital signal to determine the frequency or frequency band of the input signal 440 and produce appropriate control signals 410, 412, or 414 to tune (or instruct the controller 310 to tune) the appropriate adjustable termination impedance 210 based on the frequency or frequency band of the input signal 440. Particularly in examples in which the frequency detection circuit 400 directly controls the adjustable termination impedances 210, the decoder and level shifting circuit 448 may further adjust the amplitude (e.g., voltage level) or other characteristics of the control signals 410, 412 to suitably drive the adjustable termination impedances 210, or in certain examples provide the signal 414 with expected characteristics to the controller 310.

Figure 11A:
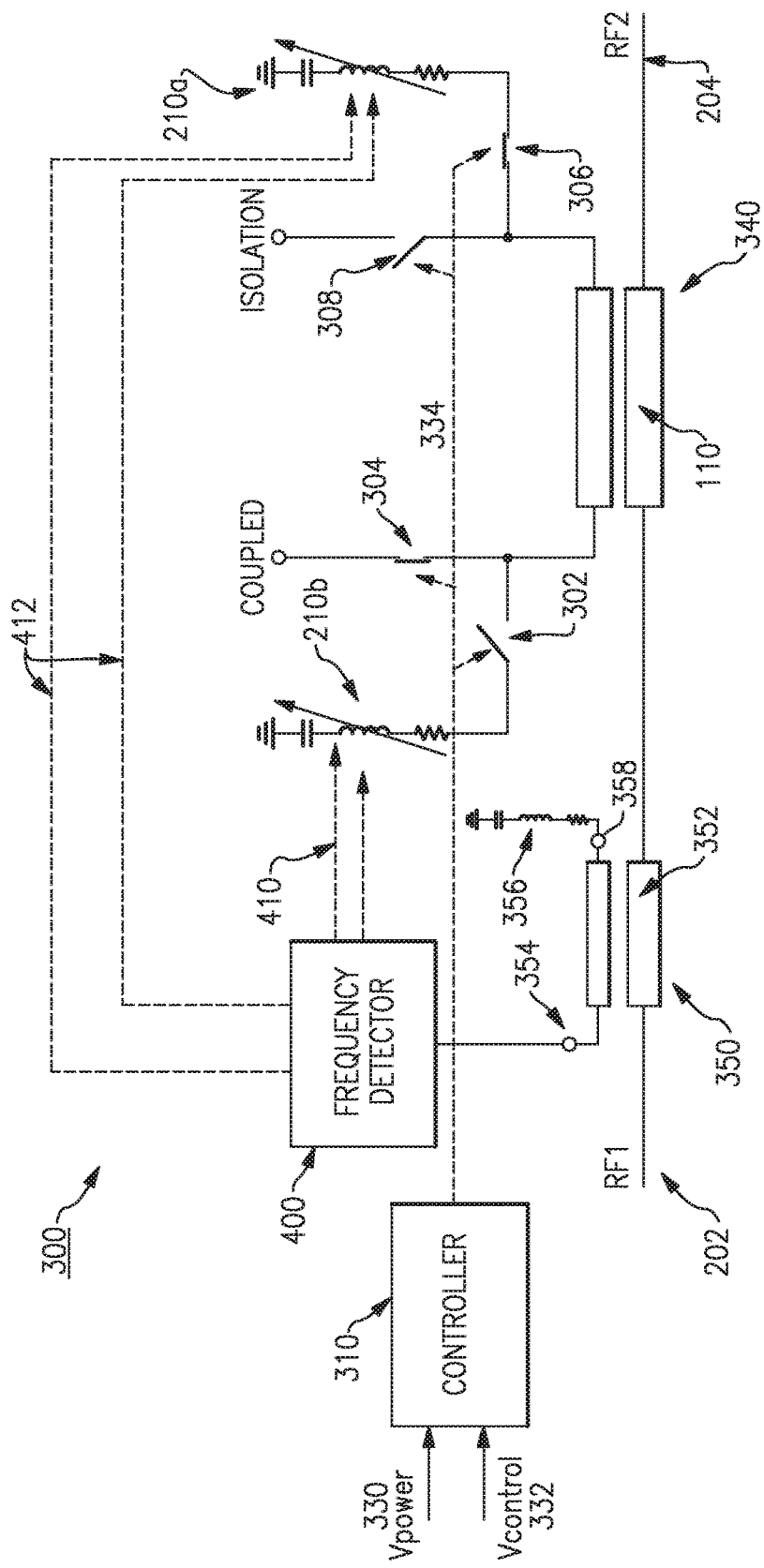
FIG. 11A is a diagram of another example of a self-adjusting electromagnetic coupler including a supplemental coupler for frequency detection.
Figure 11B:
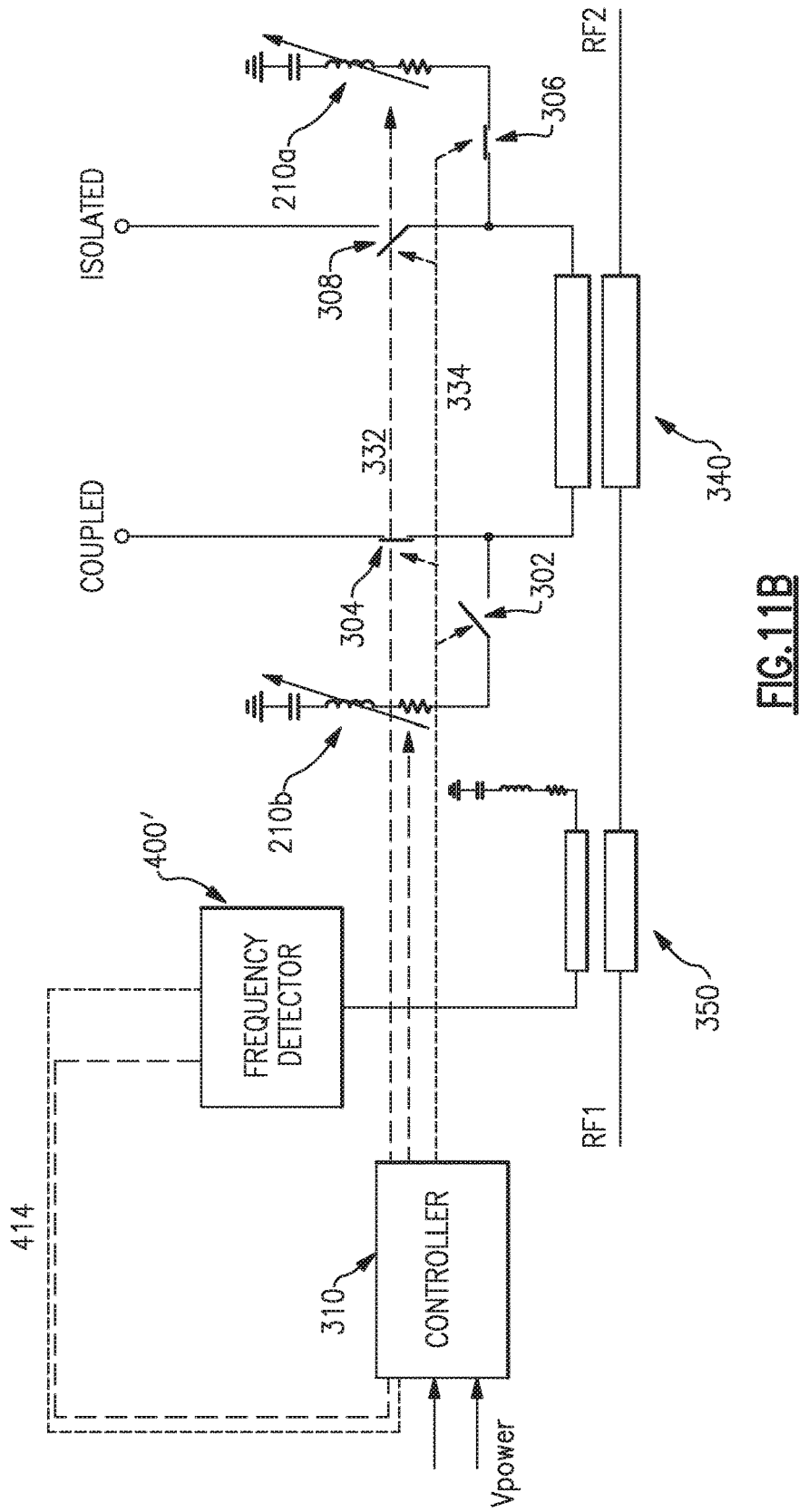
FIG. 11B is a diagram of another example of a self-adjusting electromagnetic coupler including a supplemental coupler for frequency detection.

In the embodiments discussed above, the frequency detector 400 is selectively electrically connected to the coupled port of the EM coupler 340. According to another embodiment, a dedicated additional or supplemental EM coupler 350 for frequency detection can be placed in series with the EM coupler 340 used for power measurement. FIGS. 11A and 11B illustrate examples of such an arrangement. FIG. 11A illustrates an example in which the frequency detection circuit 400 provides control signals 410, 412 to tune the adjustable termination impedances 210a, 210b, and FIG. 11B illustrates an example in which the frequency detection circuit 400' provides a signal 414 to the controller 310, which in turn provides signals 332 to tune the adjustable termination impedances 210a, 210b, as discussed above. In these embodiments, the system includes an additional EM coupler 350 having a main line 352 connected in series with the main line 110 of the EM coupler 340 used for power detection/measurement between the two power ports 202, 204. The frequency detection circuit 400 is connected to the coupled port 354 of the additional EM coupler 350. A termination impedance 356 is connected to the isolation port 358 of the additional EM coupler 350. Using the additional coupler 350 for frequency detection may provide advantages in allowing the coupling factor of the additional coupler 350 to be optimized for the frequency detection circuit 400, without affecting the desired coupling factor of the EM coupler 340. Furthermore, frequency detection can be performed without loading or otherwise interfering with the operation of the EM coupler 340. In the illustrated examples, the main line 352 of the additional coupler 350 is shown as separate from and connected in series with the main line 110 of the EM coupler 340; however, in other examples the two couplers may share a common main transmission line. Further, although FIGS. 11A and 11B show the additional coupler 350 connected on the first power port 202 side of the EM coupler 340, the additional coupler may instead be positioned between the EM coupler 340 and the second power port 204. Additionally, although the termination impedance 456 connected to the isolation port 358 of the additional coupler 350 is shown as an RLC circuit, it may be implemented in a variety of ways, as will be appreciated by those skilled the art, given the benefit of this disclosure. In certain examples the termination impedance 356 can be adjustable termination impedance 210 as discussed above, and be adjusted under the control of a control signal supplied by either the frequency detection circuit 400 or the controller 310.

Thus, aspects and embodiments provide various implementations of a self-adjusting EM coupler system 300 capable of detecting the frequency or frequency band of an input signal 220 and automatically adjusting the termination impedance based on the detected frequency information, without relying on receiving frequency information from an external source. This approach allows the EM coupler 340 to be optimized over multiple frequencies or frequency bands of operation, while reducing the required input information needed to achieve this optimization.

Figure 12:
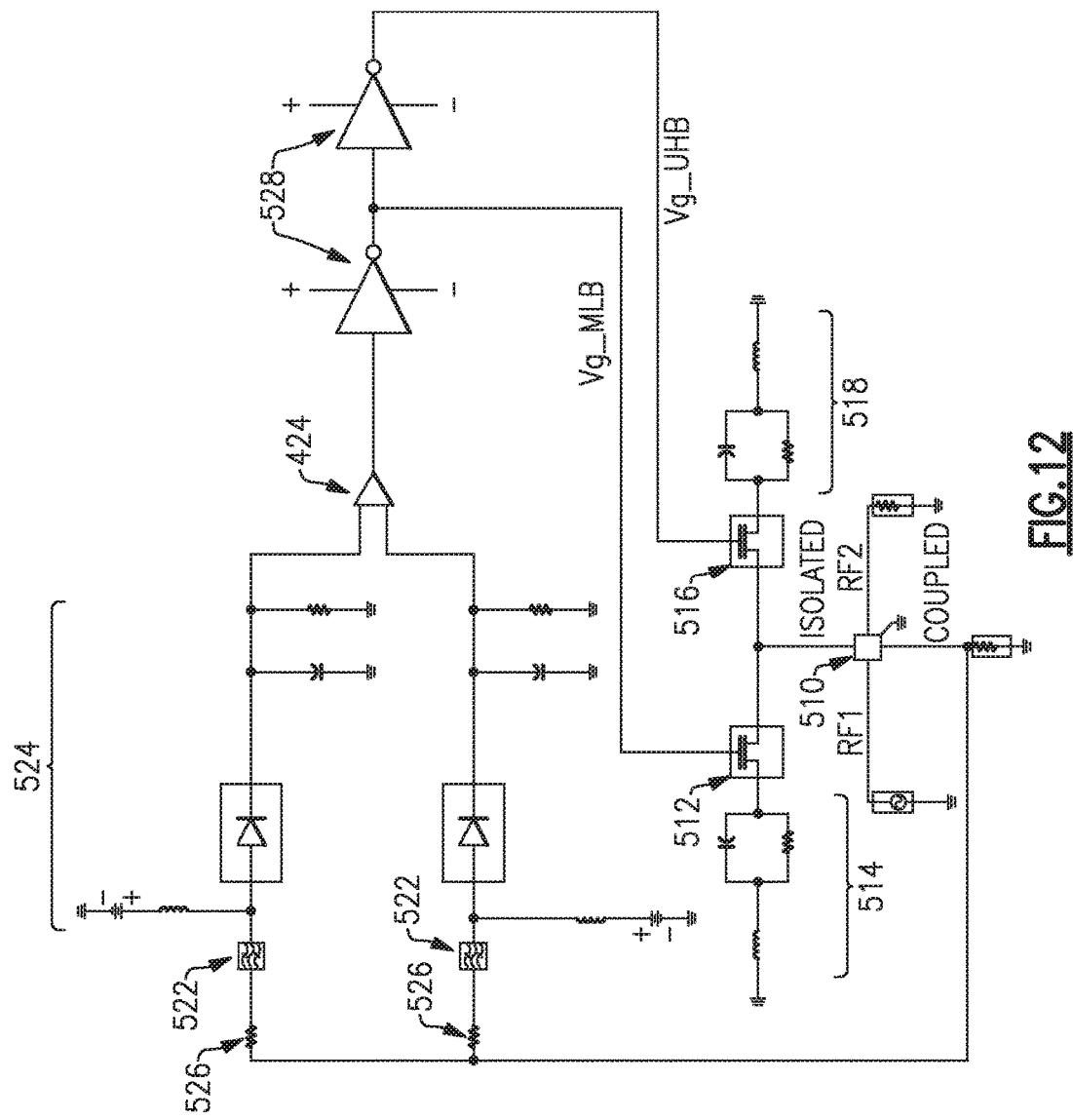
FIG. 12 is an equivalent circuit diagram of a circuit used to simulate performance of an example of a self-adjusting electromagnetic coupler.

Simulations were performed to model and demonstrate self-optimization or self-adjustment of an example of an EM coupler configured with integrated frequency detection in accord with the principles and examples discussed above. FIG. 12 is an equivalent circuit diagram illustrating the simulation circuit used for these simulations. The simulation circuit included a modeled four-port EM coupler 510 and considered two frequencies of interest, namely a "mid-band" frequency of 1.5 GHz and a "high-band" frequency of 3.5 GHz. A modeled two-channel frequency detection circuit is connected to the coupled port of the simulated EM coupler 510, and includes bandpass filters 522 and diode-based detectors and biasing circuits 524, similar to the diode-based envelope detectors 442 discussed above. Resistors 526 (simulated with a value of 1000 Ohms each) were included to isolate the coupled port of the modeled EM coupler 510 from the modeled frequency detection circuit. Each of the bandpass filters 522 were simulated as having a passband of 0.1 GHz, one centered around 1.5 GHz and the other centered around 3.5 GHz, with a ripple of 1 dB. The outputs from the two channels of the modeled frequency detection circuit are fed to a comparator 424. The isolation port of the modeled EM coupler 510 is connected via a first switch 512 to a first termination impedance 514 configured to present an impedance value to optimize the coupler directivity at the 1.5 GHz frequency, and via a second switch 516 to a second termination impedance 518 optimized for the 3.5 GHz frequency. The switches 512 and 516 are driven by switch drivers 528 connected to the output of the comparator 424. Thus, as discussed above, based on the frequency (1.5 GHz or 3.5 GHz) detected by the frequency detection circuit, the switch drivers 528 actuate the switches 512, 516 to connect the appropriate one of the two termination impedances 514, 518 to the isolation port of the modeled EM coupler 510. The switches 512, 516 are simulated as FET switches; however, those skilled in the art will appreciate that the corresponding switches 302, 306 may be implemented using any suitable switching devices or technology.

The results of simulations performed using the simulation circuit shown in FIG. 12 are presented in FIGS. 13A-B, 14A-C, 15A-B, and 16A-C. FIGS. 13A-B and 14A-C present the simulation results for a simulated input signal at 1.5 GHz, and FIGS. 15A-B and 16A-C present the simulation results for a simulated input signal at 3.5 GHz.

Figure 13A:
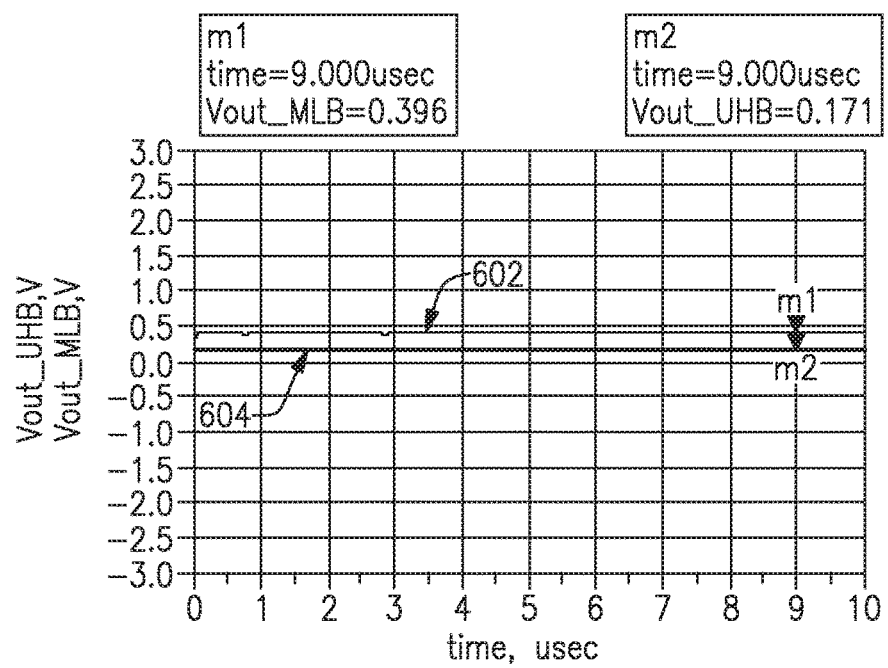
FIG. 13A is a graph showing voltages output from each channel of the modeled frequency detection circuit responsive to a simulated 1.5 GHz input signal applied at port RF1 of the modeled EM coupler.
Figure 13B:
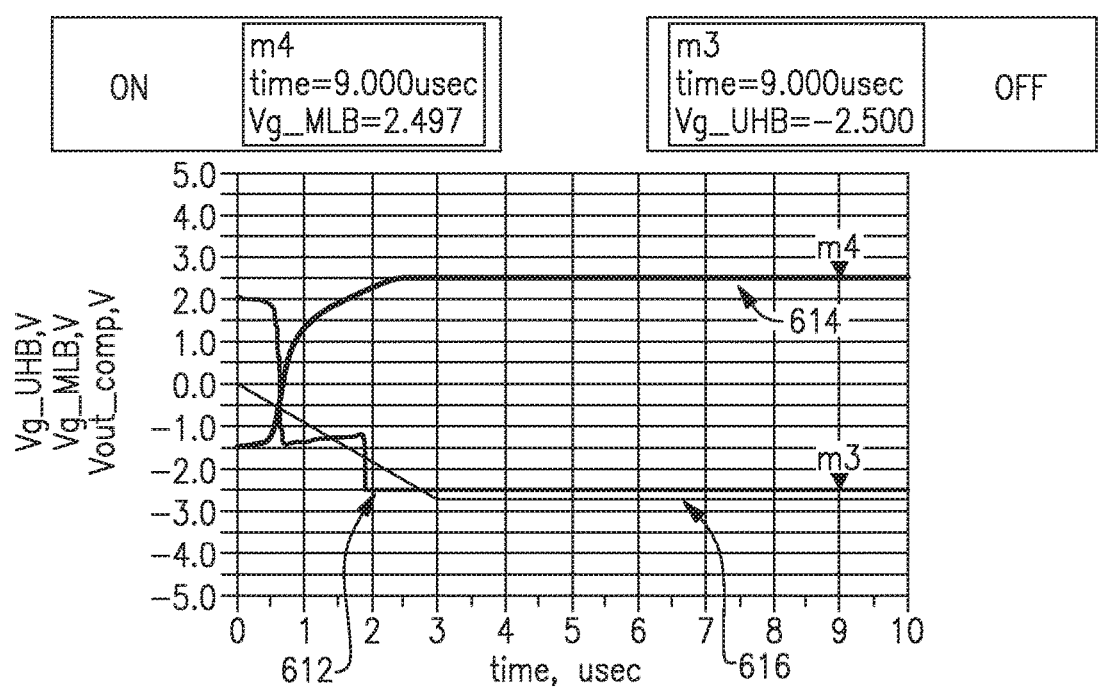
FIG. 13B is a graph showing various voltage signals in the simulation circuit of FIG. 12 responsive to the 1.5 GHz input signal applied at port RF1 of the modeled EM coupler.

FIG. 13A shows the voltages output from each channel of the modeled frequency detection circuit and input to the comparator 424 corresponding to a simulated 1.5 GHz input signal at port RF1 of the modeled EM coupler 510. Trace 602 represents the output from the "mid-band" channel, and trace 604 represents the output from the "high-band" channel. In this example, the simulated input signal was at 1.5 GHz, and therefore because this signal is within the passband of the bandpass filter 522 associated with the mid-band channel, but outside of the passband of the bandpass filter 522 associated with the high-band channel, trace 602 has a higher level than does trace 604. Accordingly, the voltage output from the comparator 424 (represented by trace 612 in FIG. 13B) indicates detection of the mid-band frequency, 1.5 GHz. As shown in FIG. 13B, this detection results in the first switch driver 528, the output of which is Vg_MLB (represented by trace 614 in FIG. 13B) turning ON to actuate the first switch 512 to connect the first termination impedance 514 optimized for the 1.5 GHz frequency to the isolation port of the modeled EM coupler 510, while the second switch driver 528, the output of which is Vg_UHB (represented by trace 616 in FIG. 13B) turns OFF to actuate the second switch 516 to decouple the second termination impedance 518 from the isolation port of the modeled EM coupler 510.

Figure 14A:
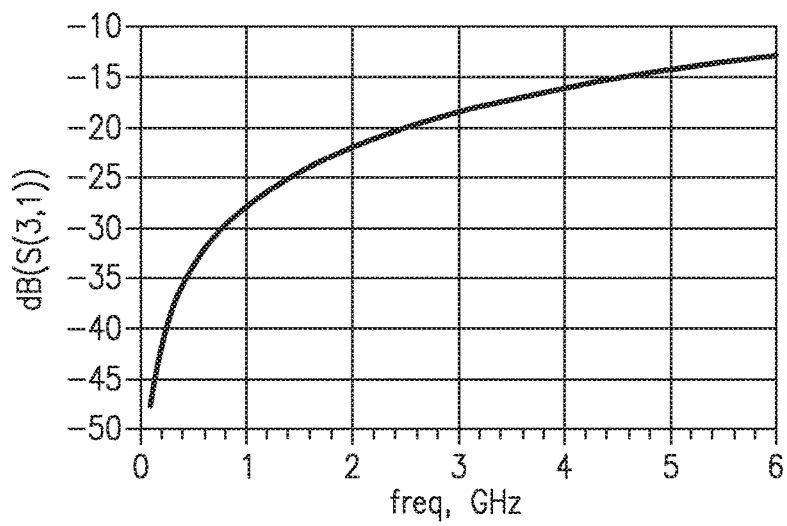
FIG. 14A is a graph of S-parameter S(3,1) of the modeled EM coupler of FIG. 12 corresponding to the 1.5 GHz input signal applied at port RF1 of the modeled EM coupler.
Figure 14B:
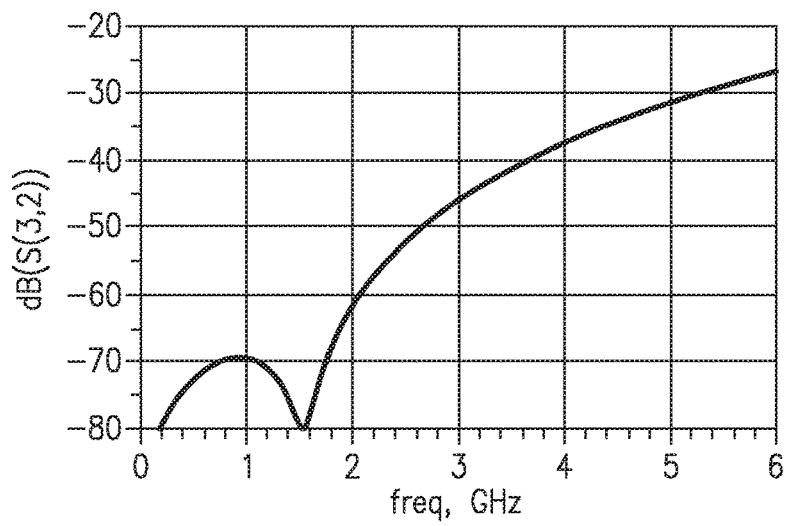
FIG. 14B is a graph of S-parameter S(3,2) of the modeled EM coupler of FIG. 12 corresponding to the 1.5 GHz input signal applied at port RF1 of the modeled EM coupler.
Figure 14C:
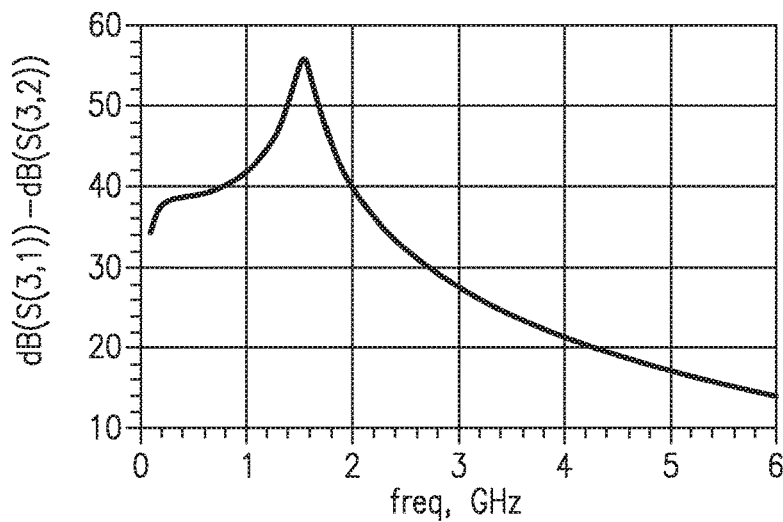
FIG. 14C is a graph of simulated coupler directivity as a function of frequency for the coupler in the equivalent circuit shown in FIG. 12 and an input signal having a frequency of 1.5 GHz.

FIGS. 14A and 14B illustrate the corresponding S-parameters, or power ratios of the coupled signal at the coupled port of the modeled EM coupler relative to the input signal at port RF1 (FIG. 14A) and the unwanted reflected signal from port RF2 (FIG. 14B), as functions of frequency. FIG. 14C shows the corresponding directivity of the modeled EM coupler 510, which as discussed above is given, in dB, Equation (2). As may be seen with reference to FIG. 14C, the directivity is optimized at a frequency of 1.5 GHz.

Figure 15A:
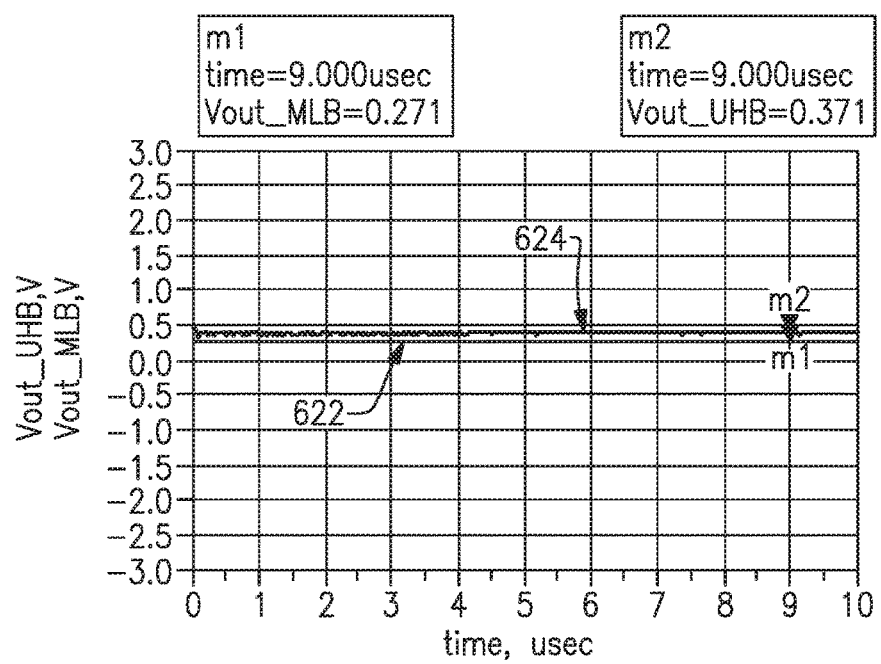
FIG. 15A is a graph showing voltages output from each channel of the modeled frequency detection circuit responsive to a simulated 3.5 GHz input signal applied at port RF1 of the modeled EM coupler.
Figure 15B:
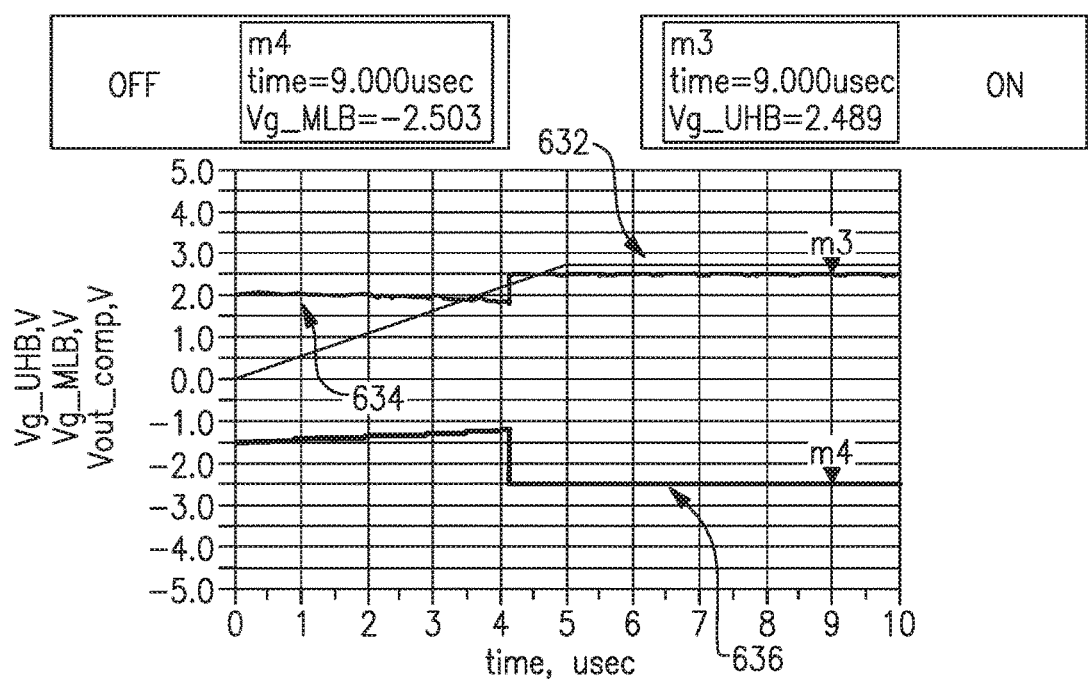
FIG. 15B is a graph showing various voltage signals in the simulation circuit of FIG. 12 responsive to the 3.5 GHz input signal applied at port RF1 of the modeled EM coupler.

FIG. 15A shows the voltages output from each channel of the modeled frequency detection circuit and input to the comparator 424 corresponding to a simulated 3.5 GHz input signal at port RF1 of the modeled EM coupler 510. Trace 622 represents the output from the "mid-band" channel, and trace 624 represents the output from the "high-band" channel. In this example, the simulated input signal was at 3.5 GHz, and therefore because this signal is within the passband of the bandpass filter 522 associated with the high-band channel, but outside of the passband of the bandpass filter 522 associated with the mid-band channel, trace 624 has a higher level than does trace 622. Accordingly, the voltage output from the comparator 424 (represented by trace 632 in FIG. 15B) indicates detection of the high-band frequency, 3.5 GHz. As shown in FIG. 15B, this detection results in the second switch driver 528, the output of which is Vg_UHB (represented by trace 634 in FIG. 15B) turning ON to actuate the second switch 516 to connect the second termination impedance 518 optimized for the 3.5 GHz frequency to the isolation port of the modeled EM coupler 510, while the first switch driver 528, the output of which is Vg_MLB (represented by trace 636 in FIG. 15B) turns OFF to actuate the first switch 512 to decouple the first termination impedance 514 from the isolation port of the modeled EM coupler 510.

Figure 16A:
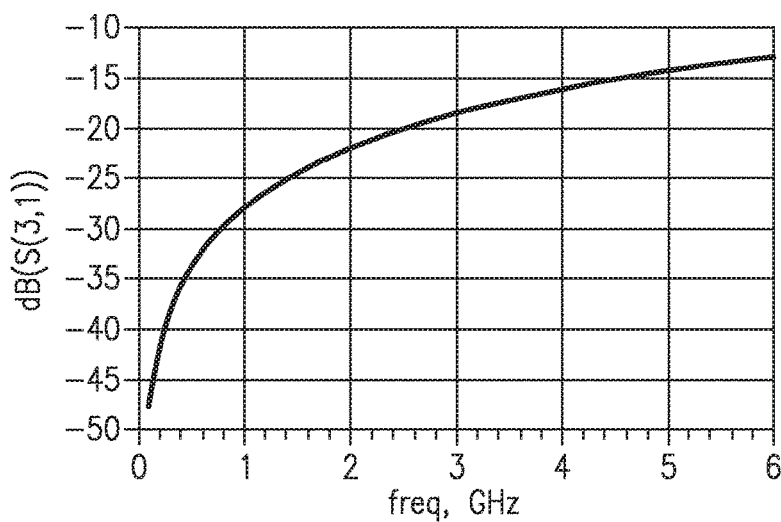
FIG. 16A is a graph of S-parameter S(3,1) of the modeled EM coupler of FIG. 12 corresponding to the 3.5 GHz input signal applied at port RF1 of the modeled EM coupler.
Figure 16B:
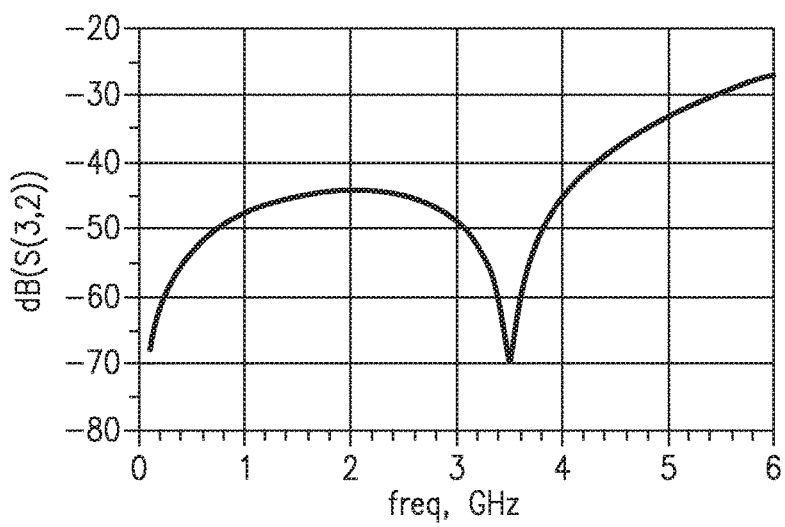
FIG. 16B is a graph of S-parameter S(3,2) of the modeled EM coupler of FIG. 12 corresponding to the 3.5 GHz input signal applied at port RF1 of the modeled EM coupler.
Figure 16C:
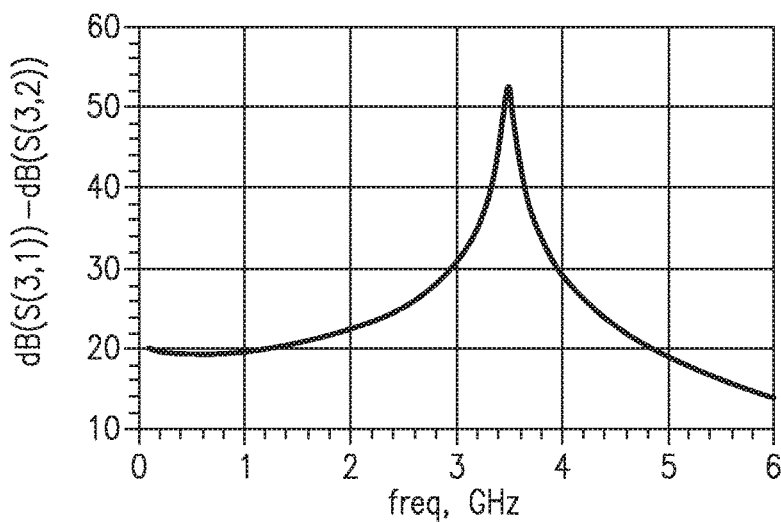
FIG. 16C is a graph of simulated coupler directivity as a function of frequency for the coupler in equivalent circuit shown in FIG. 12 and an input signal having a frequency of 3.5 GHz.

FIGS. 16A and 16B illustrate the corresponding S-parameters as functions of frequency. Specifically, FIG. 16A illustrates the power ratio of the coupled signal at the coupled port of the modeled EM coupler relative to the input signal at port RF1 as a function of frequency, and FIG. 16B illustrates the power ratio of the coupled signal at the coupled port of the modeled EM coupler relative to the unwanted reflected signal from port RF2 as a function of frequency. FIG. 16C shows the corresponding directivity of the modeled EM coupler 510, which as discussed above is given, in dB, Equation (2). As may be seen with reference to FIG. 16C, the directivity is optimized at a frequency of 3.5 GHz.

Figure 17:
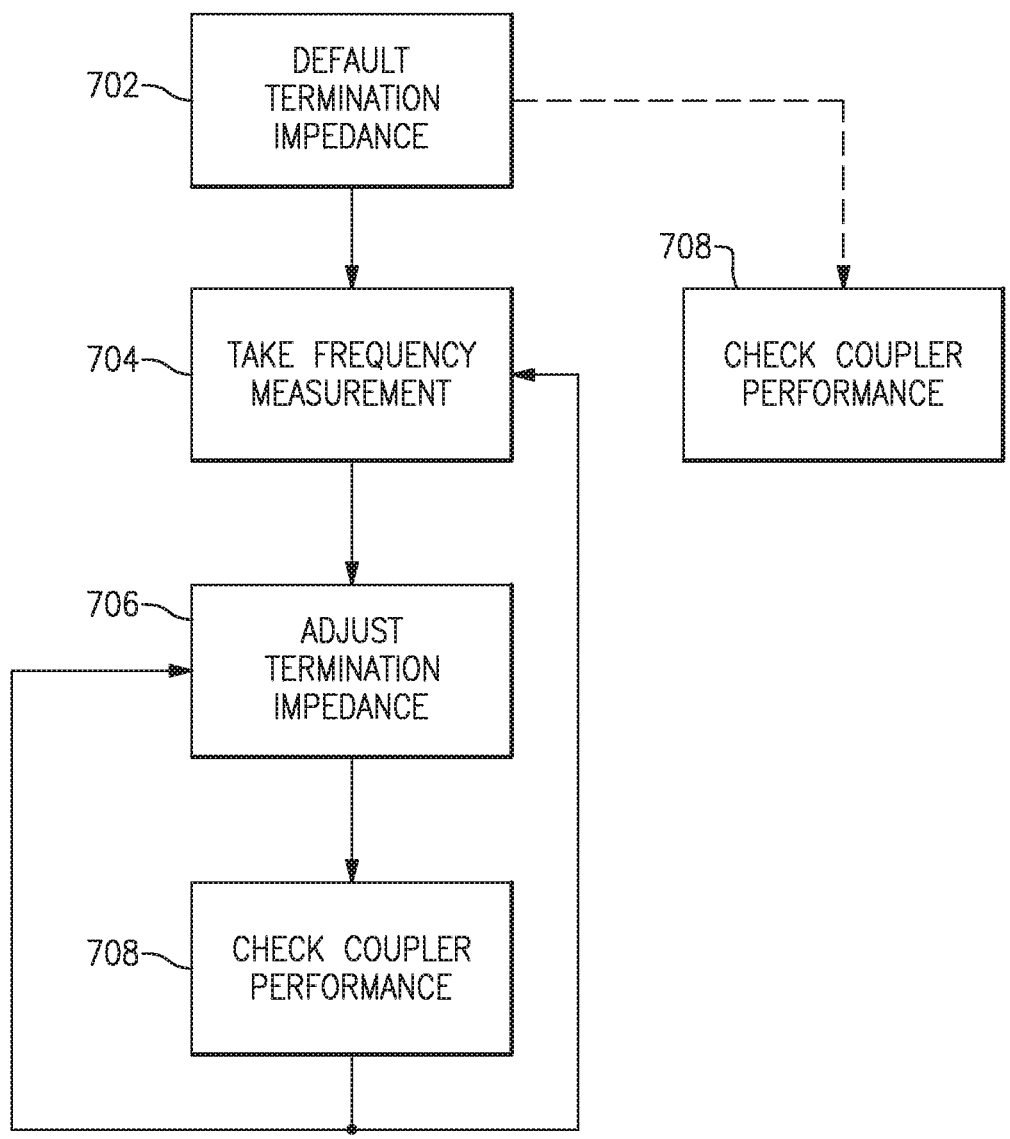
FIG. 17 is a flow diagram of one example of a method of operating a self-adjusting EM coupler assembly.

Referring to FIG. 17 there is illustrated a flow diagram of one example of a method of operating a self-adjusting EM coupler assembly or system to improve performance. When an electronic device containing the EM coupler 340 is activated, or when the self-adjusting EM coupler assembly or system is activated, the termination impedance 210 can be set to a default initial value (step 702). In certain examples the default value may be 50 Ohms; however, those skilled in the art will appreciate that any default value for the termination impedance 210 can be selected, optionally depending on known design or performance parameters. The method may optionally include a step 708 of checking performance parameters of the EM coupler 340 with the termination impedance 210 set to the default value. The performance parameters may include coupler directivity or coupling factor, for example. Measured performance parameters obtained with the termination impedance 210 set to the default value may be used as a baseline for adjusting or optimizing the performance of the EM coupler 340, or to determine whether or not any adjustment to the value of the termination impedance 210 is needed. For example, if the EM coupler 340 is operating within specified performance ranges, no tuning of the termination impedance 210 may be necessary.

The method may include a step 704 of measuring the frequency of the coupled signal to determine the frequency of the input signal 220, as discussed above. Based on the detected/measured frequency, the impedance value of the termination impedance 210 can be adjusted (step 706) as discussed above, either under the control of the frequency detector 400 directly or under the control of the controller 310. After the termination impedance 210 has been adjusted, the performance parameters of the EM coupler 340 can be checked (step 708) to determine whether any further adjustment of the termination impedance is needed to improve or optimize the coupler performance. The steps 704, 706, and 708 of measuring the frequency of the coupled signal, adjusting the termination impedance 210, and checking the coupler performance, respectively, can be repeated continuously, periodically, or at the direction of the controller 310.

Figure 18A:
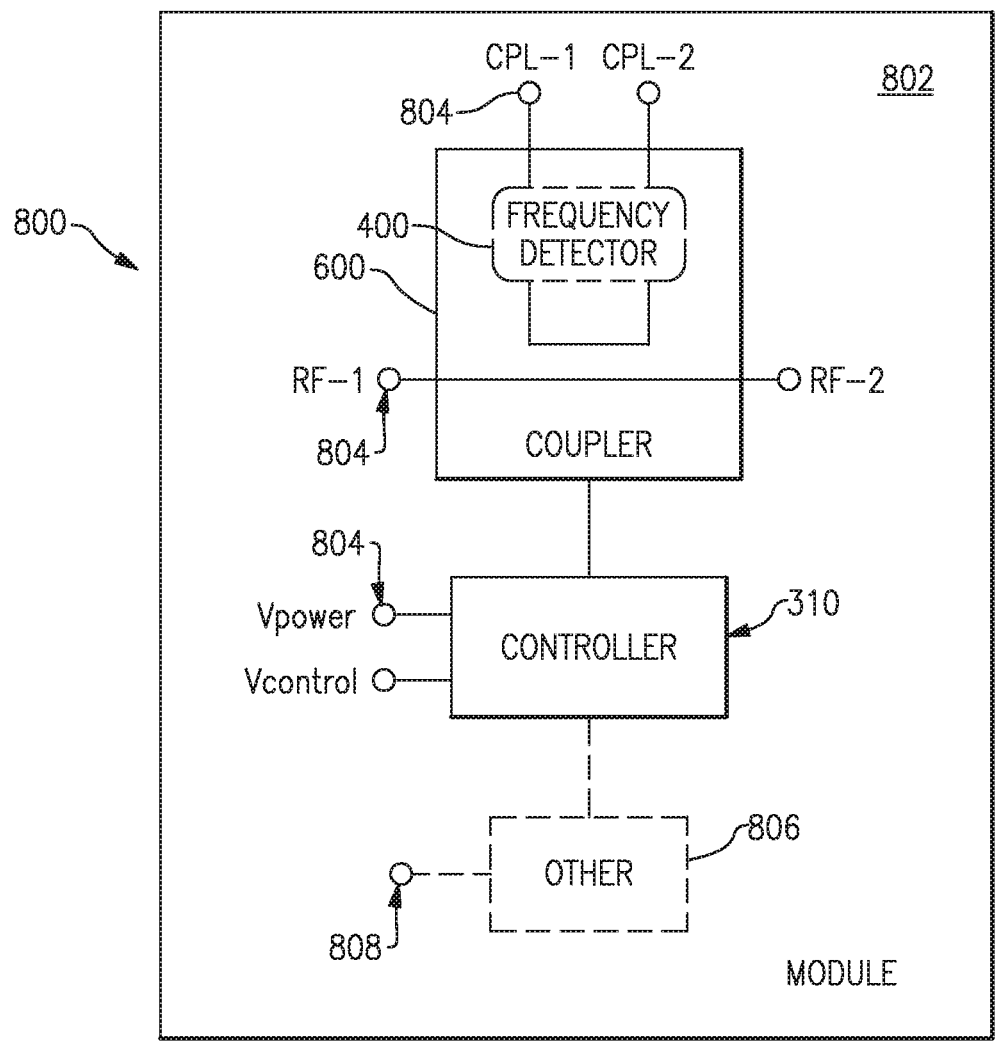
FIG. 18A is a block diagram of one example of a module including a self-adjusting electromagnetic coupler.
Figure 18B:
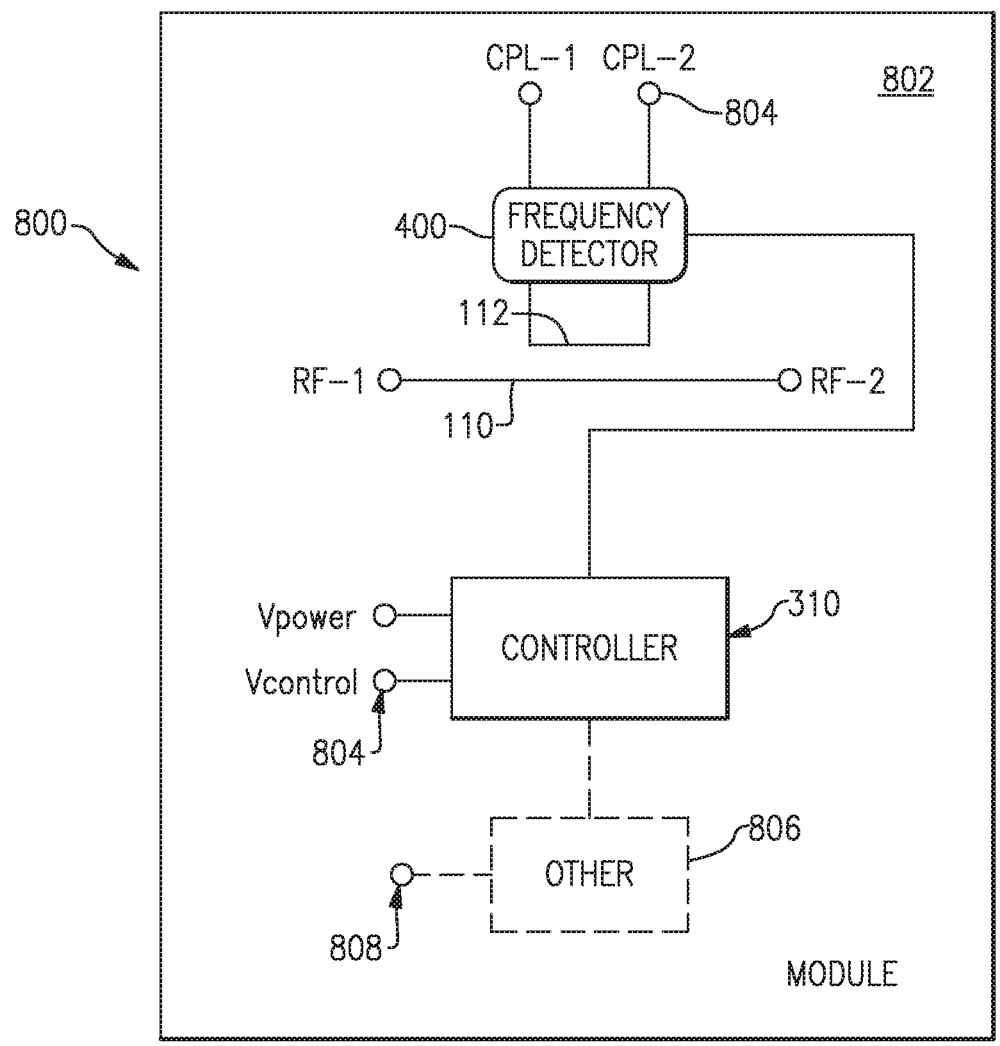
FIG. 18B is a block diagram of another example of a module including a self-adjusting electromagnetic coupler.

Embodiments of the self-adjusting EM coupler system 300 can be packaged, optionally together with outer circuitry, into a module that can be used in an electronic device. FIG. 18A is a block diagram of one example of a packaged module 800 that includes an embodiment of the self-adjusting EM coupler assembly 600, along with the controller 310. The module 800 includes a packaging substrate 802 that is configured to receive a plurality of components. In some embodiments, such components can include the self-adjusting EM coupler assembly 600 having one or more features as described herein and the controller 310. In the example illustrated in FIG. 18A, the controller 310 and the self-adjusting EM coupler assembly 600 are shown as separate dies mounted on the packaging substrate 802. However, those skilled in the art will appreciate that other configurations of the module 800 can be implemented. For example, the self-adjusting EM coupler assembly 600 and controller 310 can be combined into a single die. In another example, the EM coupler 340 can be implemented or fabricated on or in the packaging substrate using integrated circuit techniques. For example, the packaging substrate 702 can be a laminate substrate including one or metal layers and one or more dielectric layers, and the main line 110 and coupled line 112 can be implemented in one or more of the metal layers of the substrate 702. FIG. 18B is a block diagram of another example of the module 800 in which the EM coupler 340 is implemented in the substrate 802 and is connected to the frequency detector 400 implemented as a die mounted on the substrate 802. In the example of FIG. 18B, the frequency detector 400 and the controller 310 are shown as separate dies; however, in other examples they can be implemented together in a single die.

The self-adjusting EM coupler assembly 600, controller 310, and frequency detector 400 can include various connection terminals or pads 804 that can receive signals from external components or be used to connect the module to other components. In some embodiments, other circuitry or components 806 can be mounted on or formed on the packaging substrate 802. These other components 806 can optionally be connected to the controller 310 and optionally include one or more connection terminals/pads 808. In some embodiments, the module 800 can also include one or more packaging structures to, for example, provide protection and facilitate easier handling of the module 800. Such a packaging structure can include an overmold formed over the packaging substrate 802 and dimensioned to substantially encapsulate the various dies and components thereon.

Embodiments of the integrated filter-coupler disclosed herein, optionally packaged into the module 800, may be advantageously used in a variety of electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a telephone, a television, a computer monitor, a computer, a modem, a hand held computer, a laptop computer, a tablet computer, an electronic book reader, a wearable computer such as a smart watch, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, an appliance, a peripheral device, a wrist watch, a clock, etc. Further, the electronic devices can include unfinished products.

Figure 19:
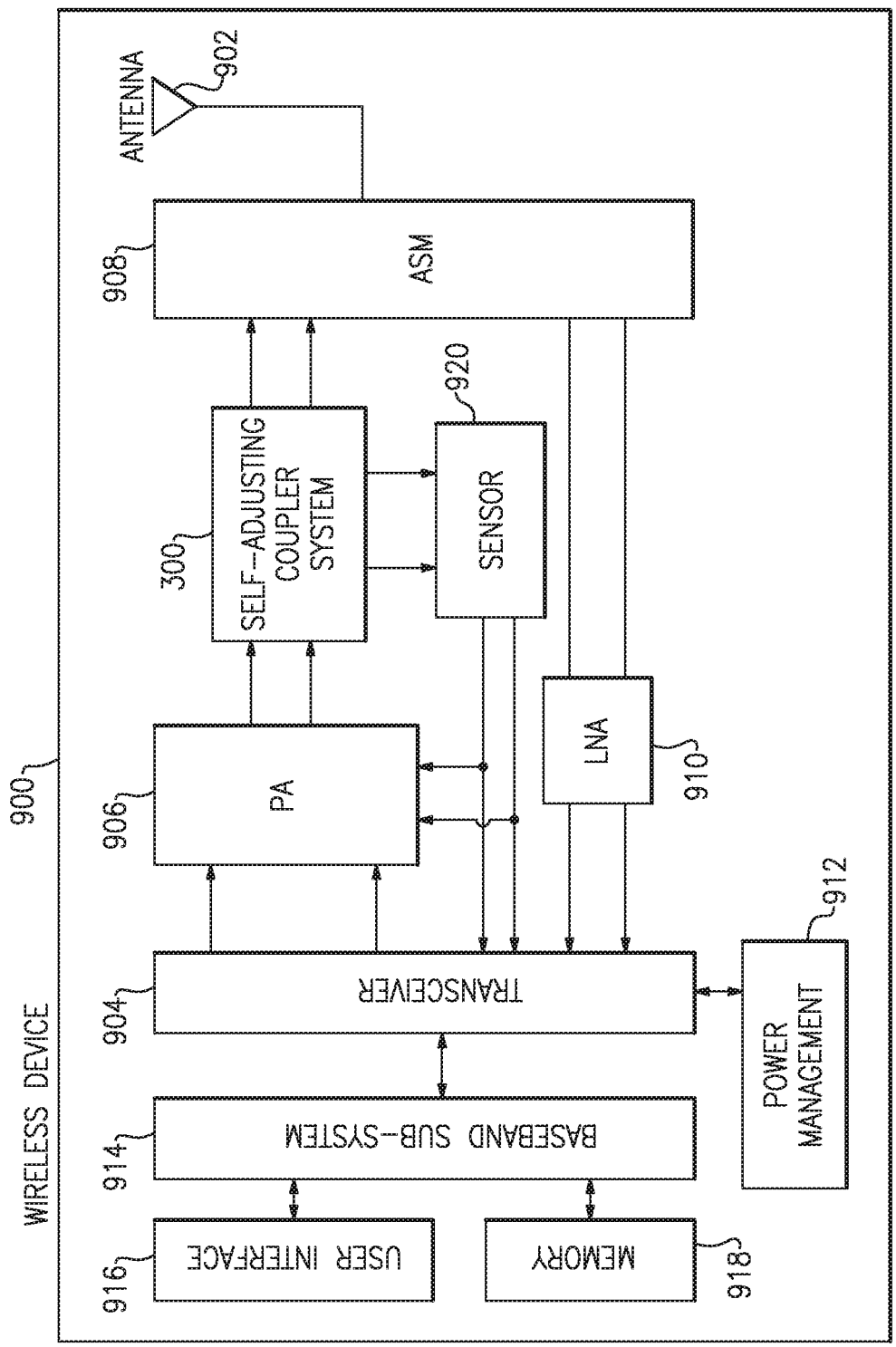
FIG. 19 is a block diagram of one example of an electronic device including a self-adjusting electromagnetic coupler.

FIG. 19 is a block diagram of a wireless device 900 including a self-adjusting EM coupler system 300 according to certain embodiments. The wireless device 900 can be a cellular phone, smart phone, tablet, modem, communication network or any other portable or non-portable device configured for voice and/or data communication. The wireless device 900 includes an antenna 902 that receives and transmits power signals, and the self-adjusting EM coupler system 300 that can use a transmitted signal for analysis purposes or to adjust subsequent transmissions, for example.

A transceiver 904 is configured to generate signals for transmission and/or to process received signals. In some embodiments, transmission and reception functionalities can be implemented in separate components (e.g. a transmit module and a receiving module), or be implemented in the same module.

Signals generated for transmission are received by a power amplifier (PA) module 906, which can include one or more PA's to amplify one or more of the generated signals from the transceiver 904. The power amplifier module 906 can be used to amplify a wide variety of RF or other frequency-band transmission signals. For example, the power amplifier module 906 can receive an enable signal that can be used to pulse the output of the power amplifier to aid in transmitting a wireless local area network (WLAN) signal or any other suitable pulsed signal. The power amplifier module 906 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the power amplifier model 906 and associated components including switches and the like can be fabricated on GaAs substrates using, for example, pHEMT or BiFET transistors, or on a Silicon substrate using CMOS transistors.

An antenna switch module 908 can be configured to switch between different bands and/or modes, such as between transmit and receive modes, etc. As shown in FIG. 19, in certain examples the antenna 902 both receives signals that are provided to the transceiver 904 via the antenna switch module 908 and a low noise amplifier module 910 and also transmits signals from the wireless device 900 via the transceiver 904, the power amplifier module 906, the self-adjusting EM coupler system 300, and the antenna switch module 908. However, in other examples multiple antennas can be used. For example, a first antenna can be used for low-band and mid-band signals, and a second antenna can be used for high-band signals.

The wireless device 900 of FIG. 19 further includes a power management system 912 that is connected to the transceiver 904 and that manages the power for the operation of the wireless device. The power management system 912 can also control the operation of a baseband sub-system 914 and other components of the wireless device 900. The power management sub-system 912 may include or be connected to a power source, such as a battery for example. The power management system 912 provides power to the wireless device 800 via the power source in a known manner, and includes one or more processors or controllers that can control the transmission of signals.

In one embodiment, the baseband sub-system 914 is connected to a user interface 916 to facilitate various input and output of voice and/or data provided to and received from the user. The baseband sub-system 914 can also be connected to memory 918 that is configured to store data and/or instructions to facilitate the operation of the wireless device, and/or to provide storage of information for the user.

Still referring to FIG. 19, the wireless device 800 includes a self-adjusting EM coupler system 300 that can be used to measure transmitted power signals from the power amplifier module 906 and that provides one or more coupled signals to a sensor module 920. The sensor module 920 can in turn send information to the transceiver 904 and/or directly to the power amplifier module 906 as feedback for making adjustments to regulate the power level of the power amplifier module 906. In this way the self-adjusting EM coupler system 300 can be used to boost/decrease the power of a transmission signal having a relatively low/high power. It will be appreciated, however, that the self-adjusting EM coupler system 300 can be used in a variety of other implementations.

In certain embodiments in which the wireless device 900 is a mobile phone having a time division multiple access (TDMA) architecture, the self-adjusting EM coupler system 300 can advantageously manage the amplification of an RF transmitted power signal from the power amplifier module 906. In a mobile phone having a time division multiple access (TDMA) architecture, such as those found in Global System for Mobile Communications (GSM), code division multiple access (CDMA), and wideband code division multiple access (W-CDMA) systems, the power amplifier module 906 can be used to shift power envelopes up and down within prescribed limits of power versus time. For instance, a particular mobile phone can be assigned a transmission time slot for a particular frequency channel. In this case the power amplifier module 906 can be employed to aid in regulating the power level one or more RF power signals over time, so as to prevent signal interference from transmission during an assigned receive time slot and to reduce power consumption. In such systems, the self-adjusting EM coupler system 300 can be used to measure the power of a power amplifier output signal to aid in controlling the power amplifier module 906, as discussed above.

The implementation shown in FIG. 19 is exemplary and non-limiting. For example, the implementation of FIG. 19 illustrates the self-adjusting EM coupler system 300 being used in conjunction with a transmission of an RF signal, however, it will be appreciated that various examples of the self-adjusting EM coupler system 300 discussed herein can also be used with received RF or other signals as well.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and it is to be appreciated that embodiments of the methods and apparatuses discussed herein are not limited in application to the details of construction and the arrangement of components set forth in the description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. The scope of the invention should be determined from proper construction of the appended claims, and their equivalents.

What is claimed is:

1. A self-adjusting electromagnetic coupler assembly comprising:
   an electromagnetic coupler having an input port, an output port, a coupled port, and an isolation port, the electromagnetic coupler including a main line extending between the input port and the output port, and a coupled line extending between the coupled port and the isolation port, the electromagnetic coupler being configured to produce a coupled signal at the coupled port responsive to receiving an input signal at the input port;
   an adjustable termination impedance connected to the isolation port; and
   a frequency detector connected to the coupled port and configured to detect a frequency of the coupled signal and to provide an impedance control signal to tune the adjustable termination impedance based on the frequency of the coupled signal.

2. The self-adjusting electromagnetic coupler assembly of claim 1 wherein the adjustable termination impedance includes a tunable resistive-capacitive-inductive circuit.

3. The self-adjusting electromagnetic coupler assembly of claim 1 wherein the adjustable termination impedance includes a network of switchable impedance elements.

4. The self-adjusting electromagnetic coupler assembly of claim 3 wherein the network of switchable impedance elements includes at least one resistive element, at least one capacitive element, and at least one inductive element.

5. The self-adjusting electromagnetic coupler assembly of claim 1 further comprising a controller coupled to the frequency detector and configured to receive the impedance control signal from the frequency detector and to tune the adjustable termination impedance responsive to the impedance control signal.

6. The self-adjusting electromagnetic coupler assembly of claim 1 wherein the electromagnetic coupler, the adjustable termination impedance, and the frequency detector are integrated into a single die.

7. The self-adjusting electromagnetic coupler assembly of claim 1 wherein the frequency detector includes a plurality of frequency selective components, a corresponding plurality of envelope detectors coupled to the plurality of frequency selective components, and at least one voltage comparator connected to the plurality of envelope detectors and configured to compare outputs of the plurality of envelope detectors and to produce an output signal responsive to the comparison, the frequency detector being further configured to provide the impedance control signal based on the output signal from the at least one voltage comparator.

8. The self-adjusting electromagnetic coupler assembly of claim 7 wherein the plurality of frequency selective components includes a plurality of bandpass filters, each bandpass filter having a unique frequency passband.

9. The self-adjusting electromagnetic coupler assembly of claim 7 wherein the plurality of frequency selective components includes a plurality of narrowband amplifiers.

10. The self-adjusting electromagnetic coupler assembly of claim 7 wherein the plurality of envelope detectors includes a plurality of diode-based detectors.

11. The self-adjusting electromagnetic coupler assembly of claim 7 wherein the frequency detector further includes an analog to digital converter connected to the at least one voltage comparator and configured to convert the output signal from the at least one voltage comparator into a digital signal.

12. The self-adjusting electromagnetic coupler assembly of claim 11 wherein the frequency detector further includes a digital decoder connected to the analog to digital converter and configured to provide the impedance control signal based on the digital signal received from the analog to digital converter.

13. A coupler module comprising:
   a packaging substrate;
   an electromagnetic coupler formed on the packaging substrate, the electromagnetic coupler having an input port, an output port, a coupled port, and an isolation port, the electromagnetic coupler including a main line extending between the input port and the output port, and a coupled line extending between the coupled port and the isolation port, the electromagnetic coupler being configured to produce a coupled signal at the coupled port responsive to receiving an input signal at the input port;
   an adjustable termination impedance connected to the isolation port; and
   a frequency detector mounted on the packaging substrate connected to the coupled port and configured to detect a frequency of the coupled signal and to provide an impedance control signal to tune the adjustable termination impedance based on the frequency of the coupled signal.

14. The coupler module of claim 13 wherein the packaging substrate is a laminate substrate including a first metal layer, a second metal layer, and a dielectric layer interposed between the first and second metal layers, the mail line of the electromagnetic coupler being formed in the first metal layer and the coupled line of the electromagnetic coupler being formed in the second metal layer.

15. The coupler module of claim 13 wherein the packaging substrate is a laminate substrate including at least one metal layer and at least one dielectric layer, the main line and the coupled line of the electromagnetic coupler being formed in the at least one metal layer of the laminate substrate.

16. The coupler module of claim 13 further comprising a controller mounted on the packaging substrate and connected to the frequency detector, the controller being configured to receive the impedance control signal from the frequency detector and to tune the adjustable termination impedance responsive to the impedance control signal.

17. The coupler module of claim 13 wherein the frequency detector includes a plurality of frequency selective components, a corresponding plurality of envelope detectors coupled to the plurality of frequency selective components, and at least one voltage comparator connected to the plurality of envelope detectors and configured to compare outputs of the plurality of envelope detectors and to produce an output signal responsive to the comparison, the frequency detector being further configured to provide the impedance control signal based on the output signal from the at least one voltage comparator.

18. A coupler module comprising:
a packaging substrate;
an electromagnetic coupler assembly die mounted on the packaging substrate, the electromagnetic coupler assembly die including an electromagnetic coupler having an input port, an output port, a coupled port, and an isolation port, an adjustable termination impedance connected to the isolation port, and a frequency detector connected to the coupled port, the electromagnetic coupler further having a main line extending between the input port and the output port, and a coupled line extending between the coupled port and the isolation port, the electromagnetic coupler being configured to produce a coupled signal at the coupled port responsive to receiving an input signal at the input port, and the frequency detector being configured to detect a frequency of the coupled signal and to provide an impedance control signal to tune the adjustable termination impedance based on the frequency of the coupled signal; and
a plurality of connection pads for connecting the electromagnetic coupler assembly to external electronic devices.

19. The coupler module of claim 18 further comprising a controller die mounted on the packaging substrate and connected to the electromagnetic coupler assembly die, the controller die including a controller configured to receive the impedance control signal from the frequency detector and to tune the adjustable termination impedance responsive to the impedance control signal.

20. The coupler module of claim 18 wherein the frequency detector includes a plurality of frequency selective components, a corresponding plurality of envelope detectors coupled to the plurality of frequency selective components, and at least one voltage comparator connected to the plurality of envelope detectors and configured to compare outputs of the plurality of envelope detectors and to produce an output signal responsive to the comparison, the frequency detector being further configured to provide the impedance control signal based on the output signal from the at least one voltage comparator.

* * * * *